(12) United States Patent
Phillips et al.

(10) Patent No.: US 7,428,477 B1
(45) Date of Patent: Sep. 23, 2008

(54) SIMULATION OF ELECTRICAL CIRCUITS

(75) Inventors: Joel R. Phillips, Sunnyvale, CA (US); Baolin Yang, Fremont, CA (US)

(73) Assignee: Cadence Design Systems, Inc., San Jose, CA (US)

(*) Notice: Subject to any disclaimer, the term of this patent is extended or adjusted under 35 U.S.C. 154(b) by 930 days.

(21) Appl. No.: 10/335,063

(22) Filed: Dec. 31, 2002

(51) Int. Cl.
*G06F 17/10* (2006.01)
*G06F 17/50* (2006.01)

(52) U.S. Cl. .................................. 703/2; 703/14; 716/7

(58) Field of Classification Search .................. 703/2, 703/14; 716/6, 7; 324/76.39; 708/801
See application file for complete search history.

(56) References Cited

U.S. PATENT DOCUMENTS

| | | | |
|---|---|---|---|
| 5,689,685 A | 11/1997 | Feldmann et al. | |
| 5,808,915 A | 9/1998 | Troyanovsky | |
| 5,920,484 A | 7/1999 | Nguyen et al. | |
| 5,995,733 A * | 11/1999 | Roychowdhury | 716/6 |
| 6,115,670 A | 9/2000 | Druskin et al. | |
| 6,151,698 A | 11/2000 | Telichevesky et al. | |
| 6,188,974 B1 | 2/2001 | Cullum et al. | |
| 6,349,272 B1 | 2/2002 | Phillips | |
| 2003/0144824 A1 * | 7/2003 | Yang et al. | 703/14 |

OTHER PUBLICATIONS

Kleiner, M.A. Steady-State Methods for Simulation of RF and Microwave Circuits, A dissertation for Tufts University, May 2002, 139 pages.*

Skelboe, S. Computation of the Periodic Steady-State Response of Nonlinear Networks by Extrapolation Methods, IEEE Transactions on Circuits and Systems, vol. CAS-27, No. 3, Mar. 1980, pp. 161-175.*

Buonomo et al., A. Numerical Analysis of the Steady-State Response of Nonlinear Circuits Using the Trigonometric Collocation Method, IEE Proceedings of Circuits, Devices and Systems, vol. 148, No. 1, Feb. 2001, pp. 45-52.*

Kleiner et al., M.A. Steady-State Determination for RF Circuits Using Krylov-subspace Methods in SPICE, 2001 IEEE MTT-S International, Microwave Symposium Digest, vol. 3, May 2001, pp. 2091-2094.*

Kleiner et al., M.A. Determining the Steady-State Responses in RF Circuits Using GMRES, CGS, and BICGSTAB Solution in sSPICE for Llnux, 2000 IEEE MTT-S International, Microwave Symposium Digest, vol. 1, Jun. 2000, pp. 87-90.*

(Continued)

*Primary Examiner*—Russell Frejd
(74) *Attorney, Agent, or Firm*—Vista IP Law Group LLP

(57) ABSTRACT

A method, computer program product, and apparatus for simulating circuits. The method comprises modeling a circuit with an appropriate system of equations, partitioning a time interval on which the system of equations is defined, producing an interpolating polynomial on the time interval, and applying a two tiered iterative approach to solve the system of equations. The approach begins by decomposing a candidate solution vector into its time domain and frequency domain components. The Fourier transform is applied to the frequency domain components and time domain methods are applied to both the time domain components and the Fourier transformed frequency domain components to generate the solution to the original system of equations. Newton's method can be used in combination with a Krylov iterative subspace solver to perform the two-tiered iteration. The computer program product and the apparatus implement the method of simulating circuits.

64 Claims, 19 Drawing Sheets

OTHER PUBLICATIONS

Kenneth S. Kundert, Introduction to RF Simulation and Its Application, IEEE J. Solid-State Circuits, Sep. 1999, 1298-1319, vol. 34, No. 9, USA.

Ricardo Telichevsky, Ken Kundert, Jacob White, Efficient AC and Noise Analysis of Two-Tone RF Circuits, Proc. 33rd Design Automation Conference, Jun. 1996, 292-297, Las Vegas, NV, USA.

Ricardo Telichevsky, Kenneth S. Kundert, Jacob K. White, Efficient Steady-State Analysis based on Matrix-Free Krylov-Subspace Methods, Proc. 32nd Design Automation Conference, Jun. 1995, 480-484, San Francisco, CA, USA.

David Long, Robert Melville, Kirk Ashby, Brian Horton, Full-chip Harmonic Balance, Proc. IEEE 1997 Custom Integrated Circuits Conference, May 1997, 379-382, USA.

Carlos P. Coelho, Joel R. Phillips, L. Miguel Silveira, Robust Rational Function Approximation Algorithm for Model Generation, Proc. 36th Design Automation Conference, Jun. 1999, 207-212, New Orleans, LA, USA.

Keith Nabors, Tze-Ting Fang, Hung-Wen Chang, Kenneth S. Kundert, Lumped Interconnect Models Via Gaussian Quadrature, 34th ACM/IEEE Design Automation Conference, 1997, 40-45, Anaheim, CA, USA.

Jose E. Schutt-Aine, Raj Mittra, Scattering Parameter Transient Analysis of Transmission Lines Loaded With Nonlinear Terminations, IEEE Transactions on Microwave Theory and Technique, Mar. 1998, 529-536, vol. 36, No. 3, USA.

Sharad Kapur, David E. Long, Jaijeet Roychowdhury, Efficient Time-Domain Simulation of Frequency-Dependent Elements, Proc. International Conference on Computer Aided-Design, 1996, 569-573, USA.

K. Engelborghs, T. Luzyanina, K.J. In 'T Hout, D. Roose, Collocation methods for the computation of periodic solutions of delay differential equations, SIAM Journal of Scientific Computation, 2000, 1593-1609, vol. 22, USA.

A. Dutt, V. Rokhlin, Fast Fourier Transforms for Nonequispaced Data, II, Applied and Computational Harmonic Analysis, 1995, 85-100, vol. 2, USA.

Baolin Yang, Joel Phillips, A multi-interval Chebyshev collocation method for efficient high-accuracy RF circuit simulation, Proc. 37th Design Automation Conference, Jun. 2000, 178-183, vol. 65, Los Angeles, CA, USA.

Bengt Fornberg, A practical guide to pseudospectral methods, Cambridge University Press, 1996, 1-231, USA.

Youcef Saad, Martin H. Schultz, GMRES: A Generalized minimal residual algorithm for solving nonsymmetric linear systems, SIAM J. Sci. Stat. Compt., Jul. 1986, 856-869, vol. 7, No. 3, USA.

Dan Feng, Joel Phillips, Keith Nabors, Ken Kundert, Jacob White, Efficient computation of quasi-periodic circuit operating conditions via a mixed frequency/time approach, Proc. 36th Design Automation Conference, Jun. 1999, 635-640, New Orleans, LA, USA.

Beyene, Wendemagegnehu T. et al., "*Krylov Subspace-Based Model-Order Reduction Techniques For Circuit Simulations*", IEEE, 1997, pp. 331-334.

Celik, Mostafa et al., "*Simulation Of Multiconductor Transmission Lines Using Krylov Subspace Order-Reduction Techniques*", IEEE Transactions on Computer-Aided Design of Integrated Circuits and Systems, vol. 16, No. 5, May 1997, pp. 485-496.

Coughran Jr., W.M. et al., "*Recent Advances In Krylov-Subspace Solvers For Linear Systems And Applications In Device Simulation*", IEEE, 1997, pp. 9-16.

Elfadel, I.M. et al., "*Stability Criteria For Arnoldi-Based Model-Order Reduction*", 1996 IEEE, pp. 2642-2645.

Feldmann, Peter et al., "*Efficient Frequency Domain Analysis Of Large Nonlinear Analog Circuits*", IEEE 1996 Custom Integrated Circuits Conference, pp. 461-464.

Gourary, M.M. et al. "*Iterative Solution Of Linear Systems In Harmonic Balance Analysis*", 1997 IEEE MTT-S Digest, pp. 1507-1509.

Gunupudi, Pavan K. et al., "*Efficient Simulation Of High-Speed Distributed Interconnects Using Kylov-Subspace Techniques*", 1998 IEEE, pp. 295-298.

Jaimoukha, Imad M., "*A General Minimal Residual Krylov Subspace Method For Large-Scale Model Reduction*", IEEE Transactions on Automatic Control, vol. 42, No. 10, Oct. 1997, pp. 1422-1427.

Phillips, J.R., "*Model Reduction Of Time Varying Linear System Using Approximate Multipoint Krylov-Subspace Projectors*", 1998 IEEE/ACM International Conference on Computer-Aided Design Digest of Technical Papers, Nov. 1998, pp. 96-102.

Silveira, Luis Miguel et al. "*Efficient Reduced Order Modeling Of Frequency Dependent Coupling Inductances Associated With 3-D Interconnect Structures*", IEEE Transactions on Components, Packaging and Manufacturing Technology, Part B, vol. 19, No. 2, May 1996, pp. 283-288.

Zunoubi, Mohammad et al, "*Efficient Time-Domain And Frequency-Domain Finite-Element Solution For Maxwell's Equations Using Spectral Lanczos Decomposition Method*", IEEE Transactions on Microwave Theory and Techniques, vol. 46, No. 8, Aug. 1998, pp. 1141-1149.

Phillips, Joel R., "Model Reduction of Time-Varying Linear Systems Using Approximate Multipoint Krylov-subspace Projectors", Proceedings of the 1998 IEEE/ACM International Conference on Computer Aided Design, 1998, pp. 96-102.

* cited by examiner

SIMULATION OF ELECTRICAL CIRCUITS

BACKGROUND AND SUMMARY

The field of the invention relates generally to the simulation of electrical circuits, and more particularly to the time domain, steady-state simulation of circuits including frequency-dependent linear components.

An important step in the process of designing and constructing radio frequency (RF) integrated circuits is simulation. Indeed, simulation can and should be performed during the design process to ensure that the ultimate goals are achievable and will be realized by the finished product. For example, simulation should be used in the design of the RF integrated circuits that are at the heart of various wireless products such as cellular telephones. Moreover, the exploding demand for high performance wireless products has increased interest in efficient and accurate simulation techniques for RF integrated circuits.

A wireless communications device is comprised of a transmitter and a receiver. Each of these components can be separated into a baseband section and an RF section. The baseband section consists of the range of transmission and reception frequencies. The RF section of the transmitter converts the processed baseband signal to the assigned channel and then sends the signal out. The RF section of the receiver receives the signal and converts it to a baseband signal.

A transmitter should be made so that a minimal amount of energy is used to transmit a standard amount of energy, while not interfering with any transceivers operating on neighboring channels. A receiver should be made so that it can recover small signals accurately, without interference from other channels, while using a minimal amount of energy.

Unfortunately, RF circuits—which are generally constructed using such components as amplifiers, filters, mixers, and oscillators—do not lend themselves to conventional simulation techniques for several reasons.

First, RF circuits have narrowband signals that ride on modulated carriers. For example, cellular telephones have a modulated bandwidth in the range of tens to hundreds of kHz—a relatively low frequency modulation signal range—that rides on a high frequency carrier signal in the range of a few GHz. Since standard simulators, such as SPICE class simulators, use transient analysis to predict the non-linear behavior of a circuit, and since this type of analysis is expensive to use to resolve low modulation frequencies in the presence of a high carrier frequency, these simulators are not well suited to RF circuit simulation.

Second, RF circuits such as mixers exhibit non-linear behavior in response to an additional, large periodic signal known as the LO. This behavior arises because these circuits translate signals from one frequency to another. Unfortunately, standard simulators perform small-signal analyses, such as are needed to predict circuit noise, by linearizing a non-linear, time-invariant circuit about a constant operating point. Therefore, they produce a linear, time-invariant representation that is unable to exhibit the frequency translation effects that are needed to correctly predict noise and gain.

Third, many linear passive components, which play a significant role in circuit behavior, are modeled in the frequency domain using analytic expressions or S-parameter tables. Distributed components are described using partial differential equations, and hence lend themselves to frequency domain analysis. In contrast, time domain simulators are structured to solve systems of first-order, ordinary differential equations. Therefore, they are of limited use by themselves in modeling distributed components.

Thus, RF circuit simulation is difficult because RF circuits typically contain signals with multiple timescale properties, since the data and carrier signals in a system are usually separated in frequency by several orders of magnitude.

When a narrowband signal is passed through a non-linear circuit, it produces a broadband signal with a relatively sparse spectrum. Special purpose RF simulators exploit this sparsity of spectrum in order to make the necessary computations tractable. For example, instead of performing a long transient analysis of a circuit driven by a periodic source, the simulator may seek to find the steady-state directly.

Circuit simulation methods ultimately solve circuit equations, i.e., systems of differential equations. They do this in either the time domain or the frequency domain.

Time domain simulation methods discretize circuit equations using finite difference methods such as the second-order Gear method. The advantage of using time domain methods is that they can select time points based on localized error estimates. As a result, they can easily handle strongly nonlinear phenomena and sharp transitions in circuit waveforms.

Frequency domain simulation methods, such as the harmonic balance method, are popular for RF circuit simulation as they have the advantage of attaining spectral accuracy for smooth waveforms. In addition, the development of matrix-free Krylov-subspace algorithms has made dedicated RF simulation tools even more popular as they can now be used to analyze circuits with thousands of devices.

RF communication circuits often contain components—particularly passive components such as transmission lines, integrated inductors, and SAW filters—where distributed effects are important. Distributed components are components that are not conveniently described by a finite-dimensional, or "lumped," state-space model because they have an infinite-dimensional state space. The term "distributed component" is used to refer to any component more conveniently described by a frequency domain or convolutional representation. Frequency domain methods have the advantage that they can be used with equal ease to simulate either distributed devices or lumped devices.

In contrast to frequency domain techniques, which have no more difficulty simulating distributed devices than lumped devices, a significant drawback of time domain methods heretofore, is that the simulation of distributed or passive components is much more difficult for them. However, since time domain methods do have the distinct advantage previously noted—that they can select time points based on localized error estimates—it is desirable to use them in simulating distributed devices, in spite of the difficulties associated with their implementation.

There are generally two approaches to using time domain methods in simulating distributed devices. The first approach is to apply a model generation tool to generate finite-dimensional, state-space models for those components. These state-space models are then easily simulated in the time domain. The second approach is to compute, the impulse response of the distributed element, and then apply a convolution approach at each time step to obtain the time domain response of the element. In transient analysis one may use a direct convolution approach to simulate these components without significant difficulty.

In the more general setting of RF circuit simulation, however, such as when using periodic steady-state analysis via shooting-Newton methods, problems arise due to the fact that the distributed components have an infinite-dimensional state space.

First it is not sufficient to calculate the state of the circuit at a single point of the periodic time interval in order to describe the periodic steady-state. Instead, the distributed state of the devices is computed. This in turn implies that the sensitivity calculation in the shooting methods involves more than the two end points of the periodic interval.

Second, the distributed components destroy the block-banded structure of the Jacobian that is exploited in preconditioner computation.

Thus, each type of method—time domain or frequency domain—has strengths that makes it useful in simulation. However, when used alone, each method has weaknesses that limit its applicability to simulating RF circuits efficiently and effectively. It is therefore highly desirable to have a way to combine the strengths of these methods and simultaneously overcome their individual weaknesses. In particular, it would be very useful to have a way to simulate an RF circuit so that on the one hand steady-state time domain analysis can be applied, while on the other hand the distributed passive components of the circuit—i.e., those with an infinite dimensional state space, or a frequency domain description,—can also be simulated.

The present invention solves these problems by providing a method, an apparatus, and a computer program product for simulating a radio frequency (RF) circuit. Various embodiments use a hybrid frequency-time approach to RF simulation. In particular, these embodiments can be used to simulate an RF circuit so that on the one hand steady-state time domain analysis can be applied, while on the other hand the distributed passive components of the circuit—e.g., those with an infinite dimensional state space, or a frequency domain description,—can also be simulated.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope. With this caveat, the invention will be described and explained with additional specificity and detail through the use of the accompanying drawings in which.

DETAILED DESCRIPTION OF THE PREFERRED EMBODIMENTS

An important step in the process of designing and constructing a circuit—such as, for example, a radio frequency (RF) integrated circuit—is simulation. Indeed, simulation can and should be performed to ensure that the ultimate goals are achievable and will be realized by the finished product. For example, simulation should be used in the production of the RF integrated circuits that are at the heart of various wireless products such as cellular telephones. Moreover, the exploding demand for high performance wireless products has increased interest in efficient and accurate simulation techniques for RF integrated circuits.

Figure 1:
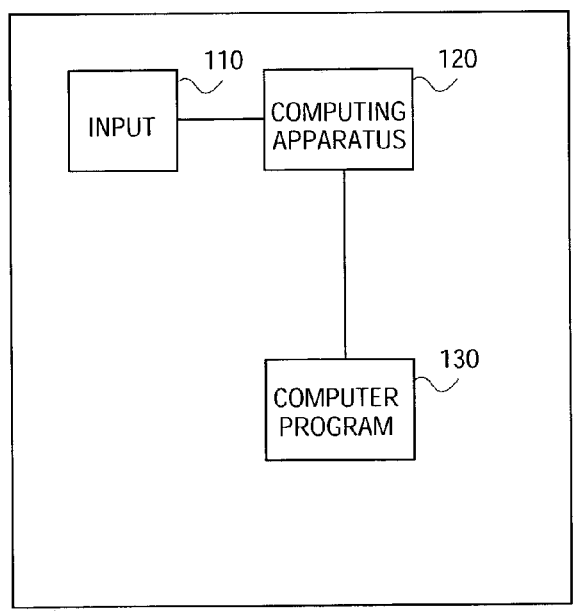
FIG. 1 is a schematic of a circuit simulation apparatus.

In accordance with one preferred embodiment of the present invention, an apparatus for accurately and efficiently simulating a circuit is provided. FIG. 1 is a schematic of the circuit simulation apparatus 100. The apparatus 100 is comprised of a computing apparatus 120 (such as a computer), a means 110 for inputting circuit data into the computer 120, and a computer program 130 that is capable of processing inputted circuit data using a hybrid frequency domain—time domain approach to simulation. In particular, the present invention can be used to simulate a circuit so that on the one hand steady-state (or alternatively, periodic steady-state) time domain analysis can be applied, while on the other hand the distributed passive components of the circuit—i.e., those with an infinite dimensional state space—can also be simulated.

Figure 2:
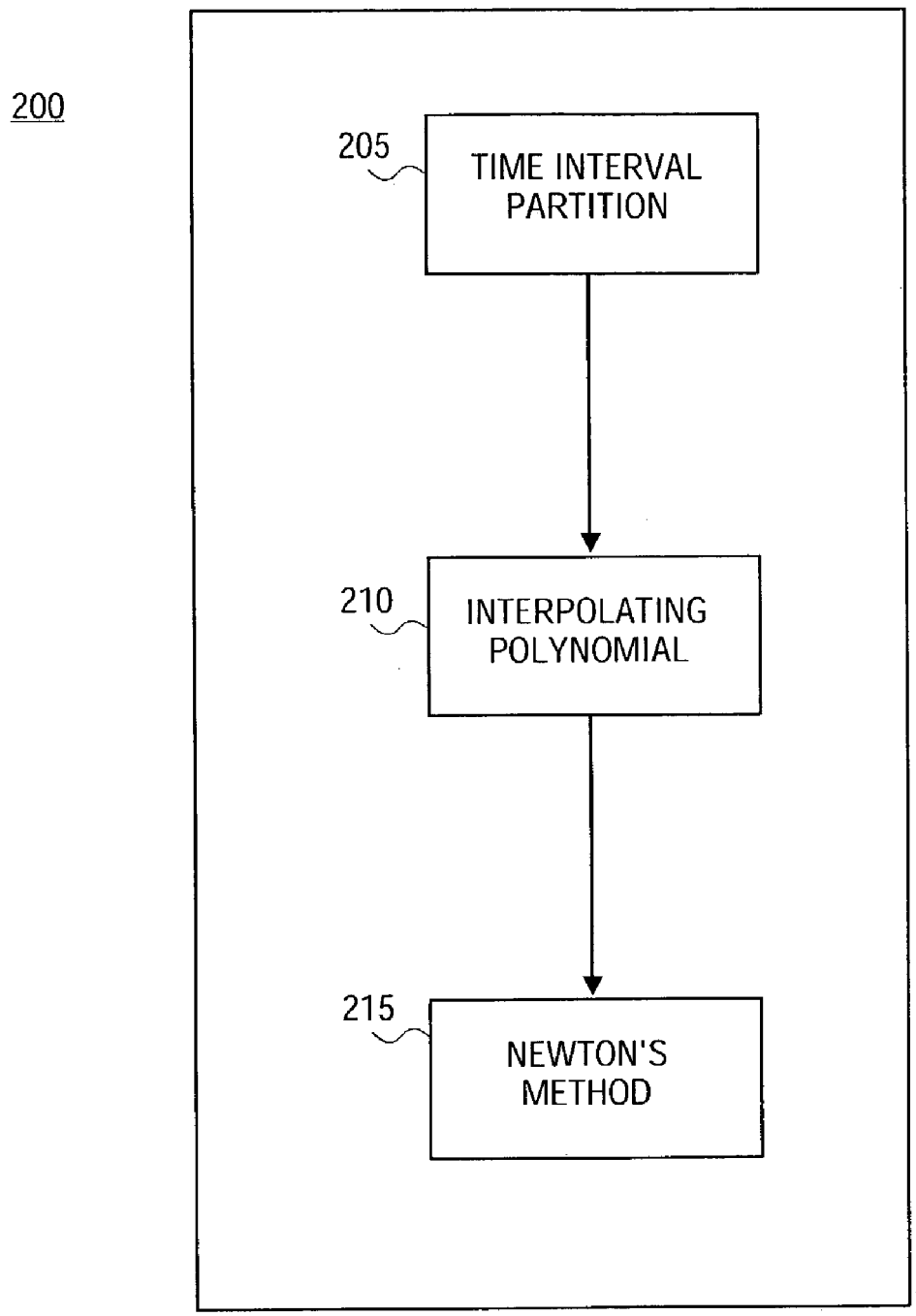
FIG. 2 is a flow chart of the steps that the apparatus of FIG. 1 performs in simulating a circuit.

The apparatus 100 produces a model of the circuit. This model is in the form of an appropriate system of equations. The apparatus 100 uses a two-tiered iterative approach to solving the system of equations. FIG. 2 is a flow chart depicting an overview of how the apparatus 100 solves the system of equations to simulate the circuit. As will be discussed in detail below, the apparatus 100 partitions a time interval 205 on which the system of equations is defined, and produces an interpolating polynomial 210 on the interval. The interpolating polynomial 210 provides an initial approximation to the solution, and is used in an iterative method to generate the next approximation. A preferred iterative method is Newton's method 215, and it serves as the top tier of the two-tiered iteration approach used by the apparatus 100.

Figure 3:
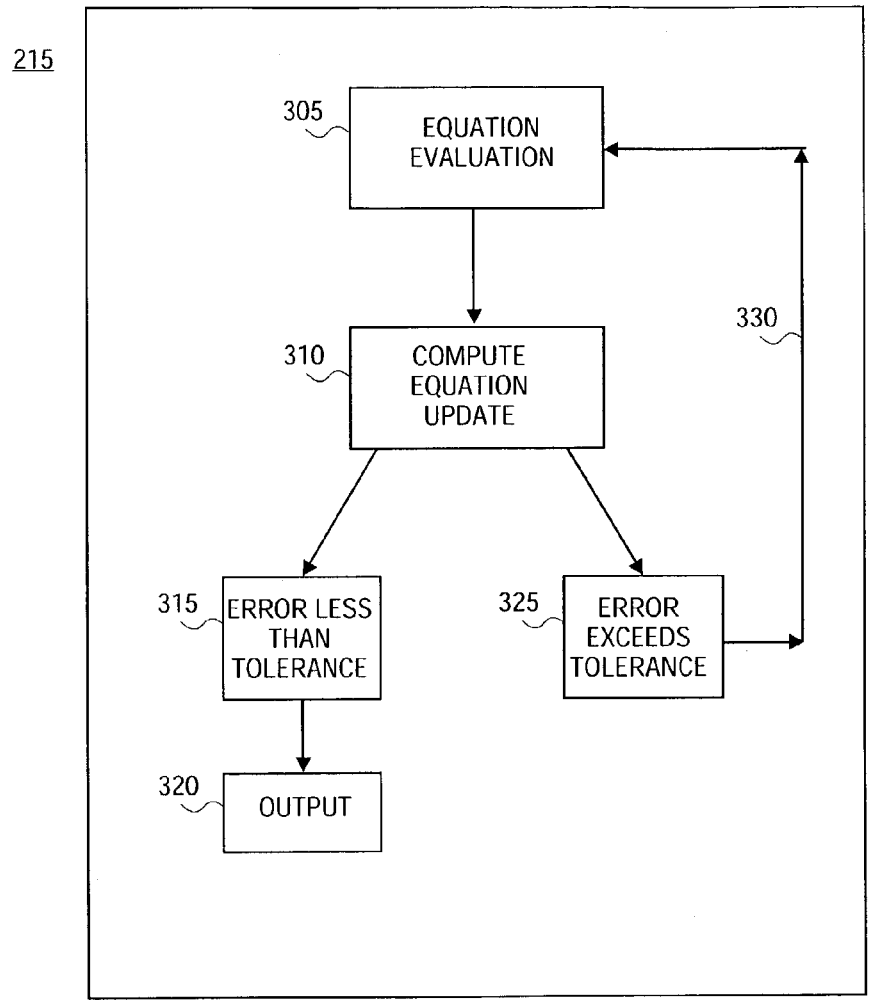
FIG. 3 is a flow chart of the Newton's method step in FIG. 2, performed by the apparatus of FIG. 1 in simulating a circuit.

FIG. 3 is a flow chart showing the implementation of Newton's method 215 to generate the next approximation, and ultimately a solution to the system of equations. The most recent approximation is evaluated in the appropriate iterative equation 305. The result is used to update the equation 310 and an error term is calculated. The error term is compared to a preset tolerance. If the error exceeds the tolerance 325 another iteration is performed 330. Otherwise, if the error is less than the tolerance 315 the iteration stops and the solution is provided as an output 320.

Figure 4:
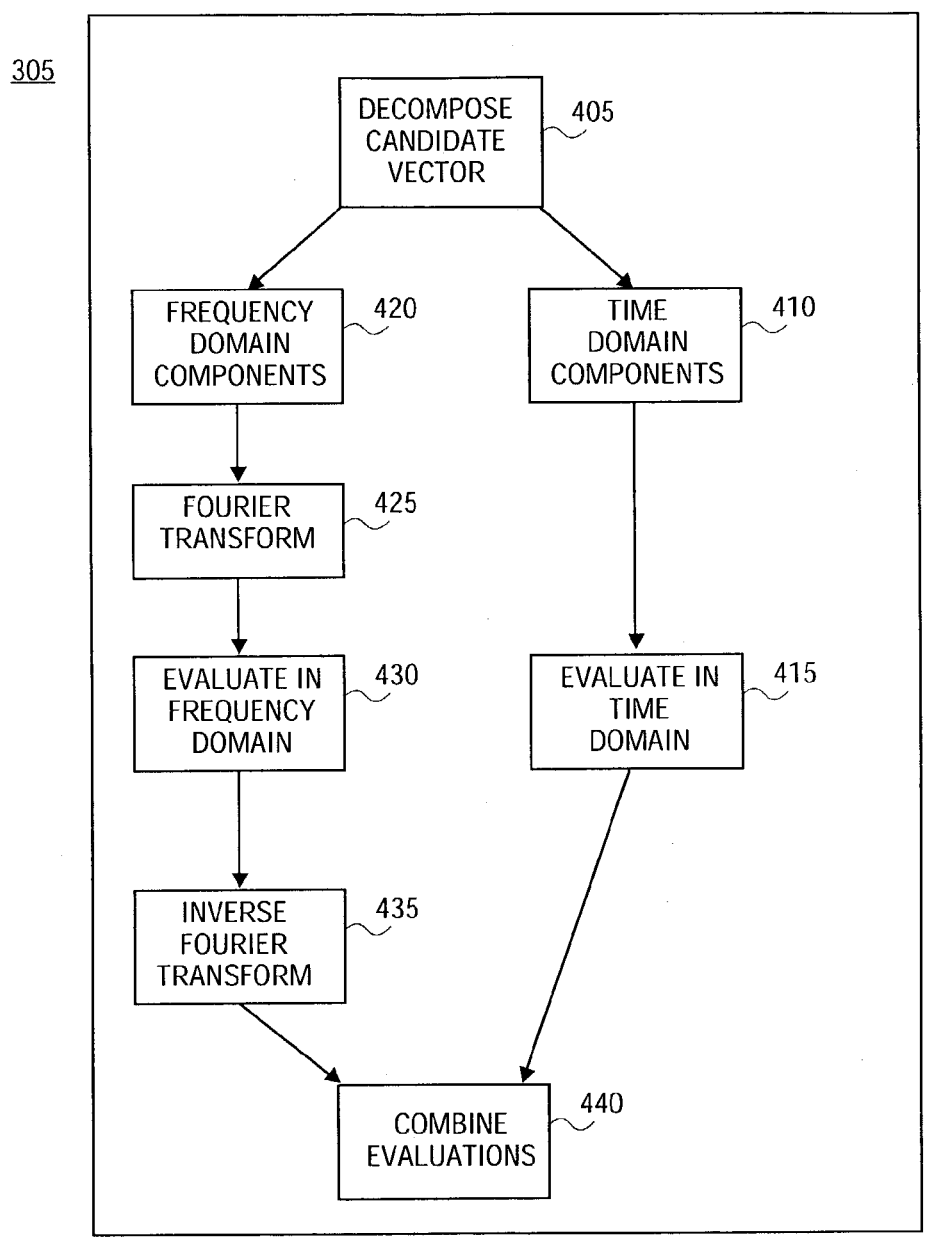
FIG. 4 is a flow chart of the equation evaluation step in FIG. 3, as performed by the apparatus of FIG. 1 in simulating a circuit.

The equation evaluation step 305 of FIG. 3 is shown in greater detail in FIG. 4, which is a flow chart of the evaluation step 305. The candidate solution vector is decomposed 405 into its frequency domain components 420 and its time domain components 410. The apparatus 100 takes the Fourier transform 425 of the frequency domain components, evaluates the result in the frequency domain 430, and then takes the inverse Fourier transform 435 of the evaluation. Meanwhile, the apparatus evaluates the time domain components in the time domain 415. The inverse Fourier transformed evaluation 435 is then combined with the time domain evaluation 415 to produce the equation evaluation 305.

Figure 5:
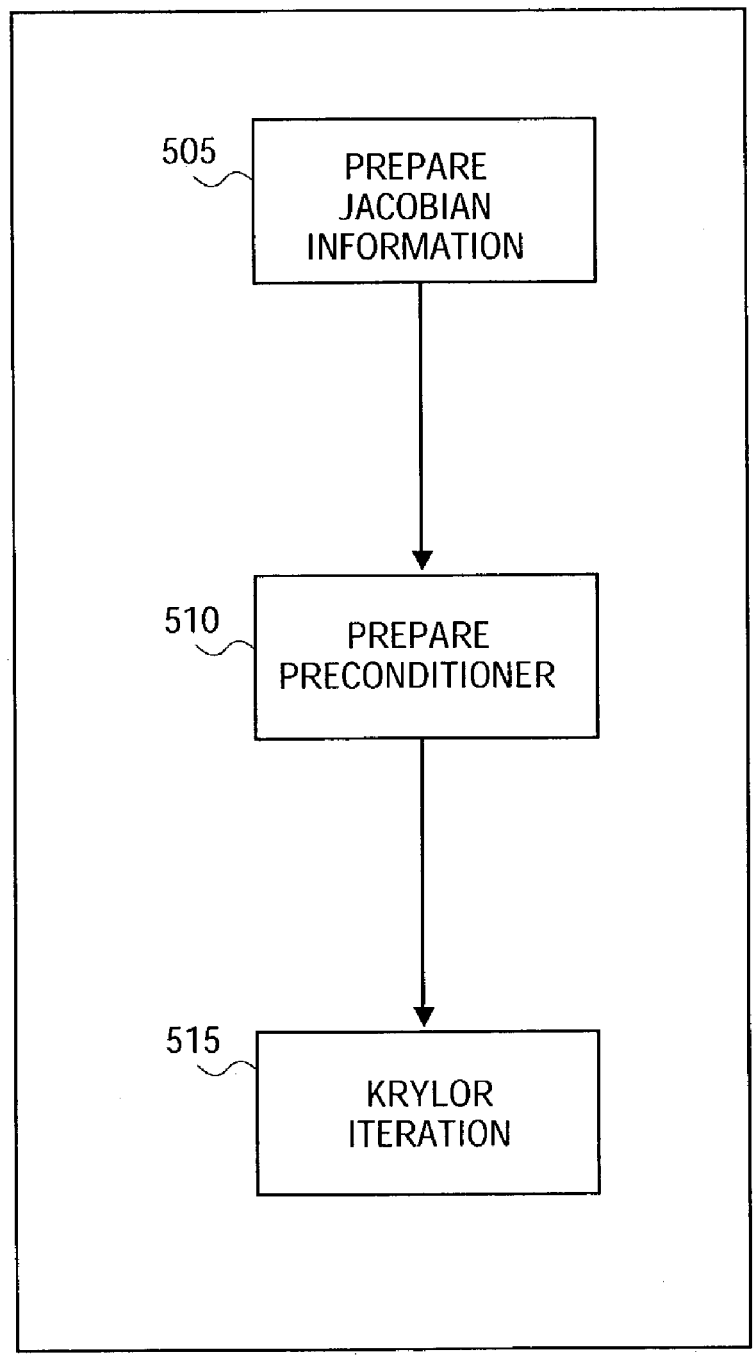
FIG. 5 is a flow chart of the equation update step in FIG. 3, as performed by the apparatus of FIG. 1 in simulating a circuit.

FIG. 5 is a flow chart of the equation update step 310 of FIG. 3, i.e., of Newton's method 215 (or other suitable iterative method). The apparatus prepares information on the Jacobian matrix 505 used in the iterations of Newton's method 215. It also prepares a preconditioner 510 to help speed up convergence to the solution. It then performs the lower tier iteration, which in a preferred embodiment uses a Krylov iterative subspace solver 515, which will be discussed in detail below.

Figure 6:
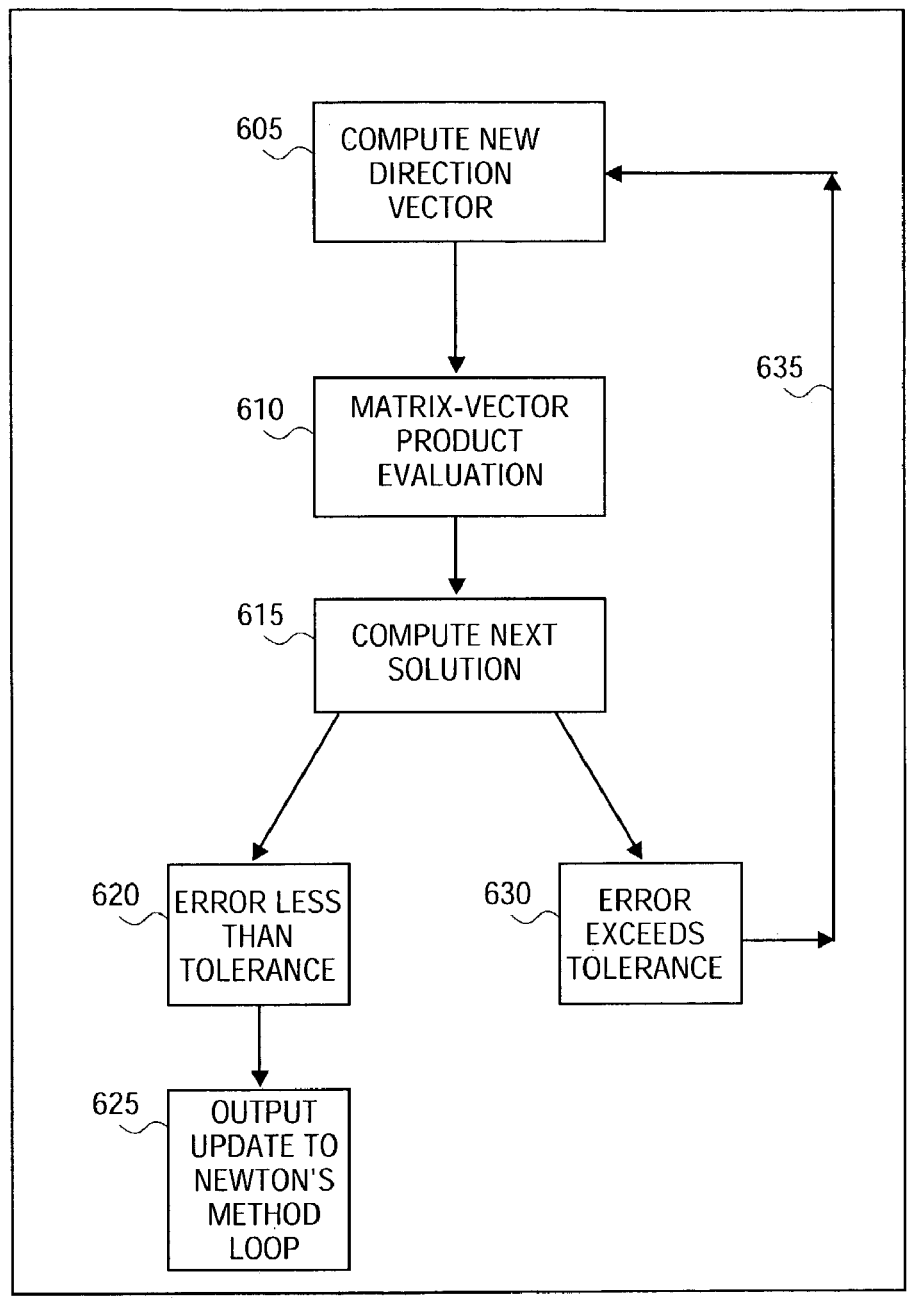
FIG. 6 is a flow chart of the Krylov iteration step in FIG. 5, as performed by the apparatus of FIG. 1 in simulating a circuit.

FIG. 6 is a flow chart of the Krylov iterative subspace solver 515 of FIG. 5. The Krylov solver 515 computes a new direction vector 605, and uses it to compute a matrix-vector product evaluation 610 that is part of this lower tier iteration. The result of this evaluation 610 is used to compute the next solution approximation 615. An error term is calculated and compared to a preset tolerance that can—but need not necessarily—be the same as the tolerance used in the top tier iteration discussed above. If the error exceeds the tolerance 630, another iteration is performed 635. Otherwise the solution is provided as an output to be used to update 625 next iteration of the Newton's method loop 310 in FIG. 3.

Figure 7:
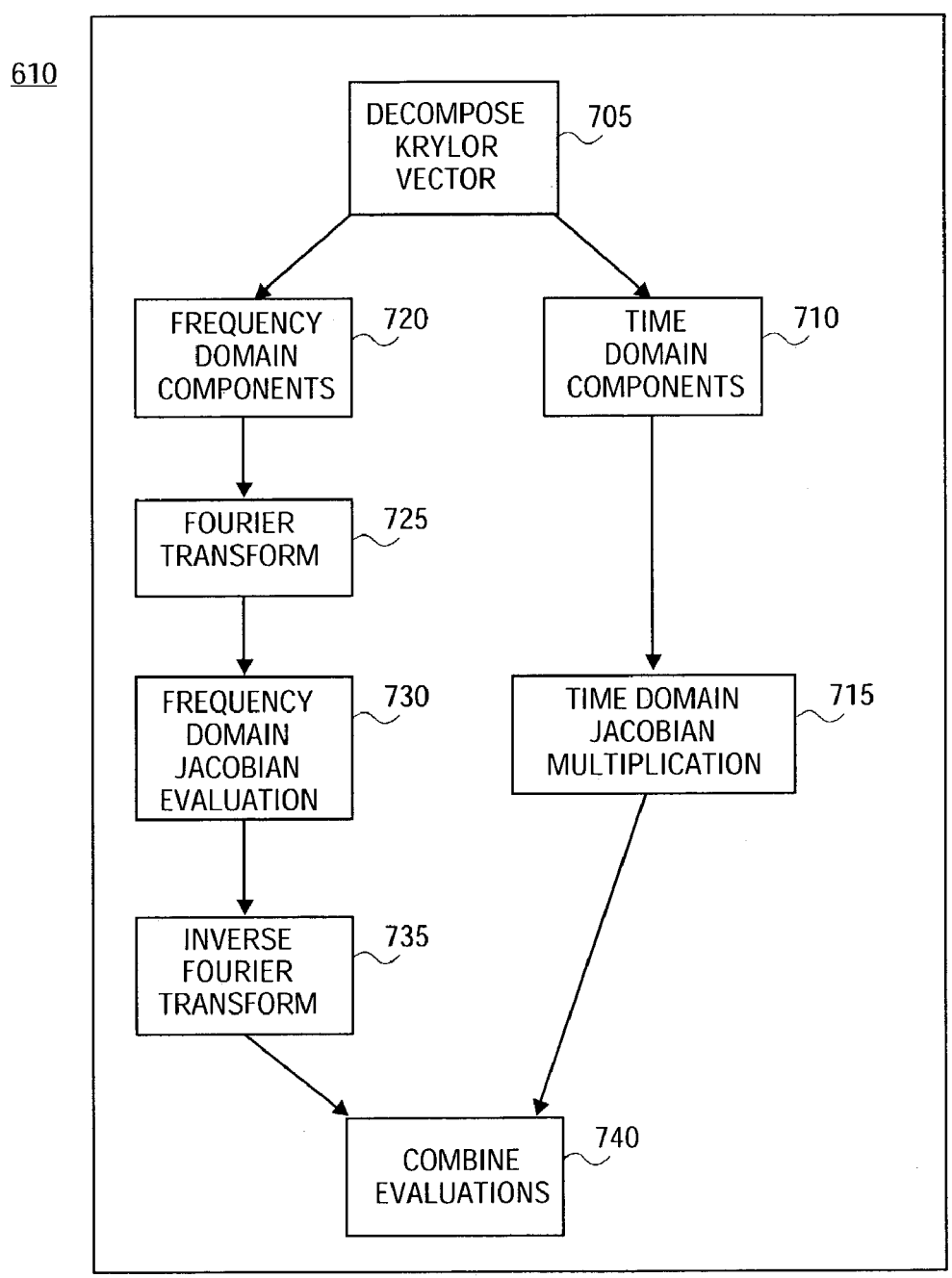
FIG. 7 is a flow chart of the matrix-vector product evaluation step in FIG. 6, as performed by the apparatus of FIG. 1 in simulating a circuit.

FIG. 7 is a flow chart of the matrix-vector product evaluation 610 step of FIG. 6. The Krylov subspace vector is decomposed 705 into its frequency domain components 720 and its time domain components 710. The apparatus 100 takes the Fourier transform 725 of the frequency domain components 720, performs a frequency domain Jacobian matrix evaluation 730 on the result, and then takes the inverse Fourier transform 735 of the evaluation 730. The apparatus 100 also performs a time domain Jacobian matrix multiplication 715 using the time domain components 710. The result of this multiplication 715 is combined with the inverse Fourier transform 735 of the frequency domain evaluation 730 to produce the next Krylov solution approximation 615.

A. TIME-FREQUENCY DECOMPOSITION

As a non-limiting example, consider a two-port system. The distributed component properties can be partitioned into time and frequency domain representations as follows. For each port in the distributed component, there is a port equation in the circuit equations. For a two-port system, one of the ports satisfies the relation:

$$(1-s_{11})e_1 + (s_{11}-1)e_1' - s_{12}\sqrt{\frac{R_1}{R_2}}\,e_2 +$$
$$s_{12}\sqrt{\frac{R_1}{R_2}}\,e_2' - (s_{11}+1)R_1 i_1 - s_{12}\sqrt{R_1 R_2}\,i_2 = 0,$$

where $S(\omega)=(s_{ij})$ is the scattering parameter matrix—which is frequency dependent—$e_j$ and $e_j'$ are used to denote the potential at port j, $R_j$ is the resistance at port j, and $i_j$ is the current at port j. The other port satisfies the relation:

$$-s_{21}\sqrt{\frac{R_2}{R_1}}\,e_1 + s_{21}\sqrt{\frac{R_2}{R_1}}\,e_1' - (1-s_{22})e_2 +$$
$$(s_{22}-1)e_2' - s_{21}\sqrt{R_1 R_2}\,i_1 - (s_{22}+1)R_2 i_2 = 0.$$

Since the S-parameter in this formula is frequency dependent, the corresponding equations in the time domain are more complicated but, as will be seen, they can be readily obtained using frequency-time domain transformations. For periodic steady state analysis, the spectrum of the solutions is at integer multiples of the fundamental frequency, which makes the transformation particularly simple. In some cases it is also convenient to decompose the port equations into a frequency-described S-parameter part and a time-described part.

The first port equation can be decomposed into:

$$A_1 = (1-\bar{s}_{11})e_1 - (1-\bar{s}_{11})e_1' - \bar{s}_{12}\sqrt{\frac{R_1}{R_2}}\,e_2 +$$
$$\bar{s}_{12}\sqrt{\frac{R_1}{R_2}}\,e_2' - (1+\bar{s}_{11})R_1 i_1 - \bar{s}_{12}\sqrt{R_1 R_2}\,i_2 \text{ and}$$
$$B_1 = (\bar{s}_{11}-s_{11})e_1 + (s_{11}-\bar{s}_{11})e_1' - (s_{12}-\bar{s}_{12})\sqrt{\frac{R_1}{R_2}}\,e_2 +$$
$$(s_{12}-\bar{s}_{12})\sqrt{\frac{R_1}{R_2}}\,e_2' - (s_{11}-\bar{s}_{11})R_1 i_1 - (s_{12}-\bar{s}_{12})\sqrt{R_1 R_2}\,i_2,$$

where $A_1+B_1=0$. Likewise the second port equation can be decomposed into:

$$A_2 = -\bar{s}_{21}\sqrt{\frac{R_2}{R_1}}\,e_1 + \bar{s}_{21}\sqrt{\frac{R_2}{R_1}}\,e_1' +$$
$$(1-\bar{s}_{22})e_2 + (1-\bar{s}_{22})e_2' - \bar{s}_{21}\sqrt{R_1 R_2}\,i_1 - \bar{s}_{22}R_2 i_2 \text{ and}$$
$$B_2 = -(s_{21}-\bar{s}_{21})\sqrt{\frac{R_2}{R_1}}\,e_1 + (s_{21}-\bar{s}_{21})\sqrt{\frac{R_2}{R_1}}\,e_1' - (s_{22}-\bar{s}_{22})e_2 +$$
$$(s_{22}-\bar{s}_{22})e_2' - (s_{21}-\bar{s}_{21})\sqrt{R_1 R_2}\,i_2 - (s_{22}-\bar{s}_{22})R_2 i_2,$$

where $A_2+B_2=0$

In general, S-parameters with bars in the split equations are the S-parameters of some time domain effect such as delay, DC offset, or linear scale. These time domain effects can be calculated in the time domain separately. One simple, non-limiting example is to choose constants for the approximation when the S-parameters at high frequencies approach a constant. Then the frequency-dependent parts, $B_1$ and $B_2$, do not have any high-frequency effects and the impacts of $B_1$ and $B_2$ can be calculated in the frequency domain using Fourier transforms, but without exhibiting oscillations in the sharp transition regions of the time domain waveform. This oscillating behavior in the sharp transition regions of the time domain waveform is known as Gibbs phenomenon.

Moreover, the solution procedure of a preferred embodiment of the present invention can be performed with any time domain, periodic, steady-state solution method. However, one important factor in the implementation is the efficient evaluation of the Fourier transforms. While any method of taking the Fourier transform may, in principle, be used, a preferred embodiment of the present invention uses the method of Chebyshev Fourier quadrature. This method will be discussed in more detail below. However, before describing this method, the discussion focuses on the equations used in the modeling step.

B. THE MODELING EQUATIONS

In the modeling step, the type of circuit determines the form of the model. Lumped circuit behavior—which can be dealt with using time domain methods—can be described by a set of N non-linear differential algebraic equations that can be written, without loss of generality, as:

$$\frac{dQ(v(t))}{dt} + I(v(t)) + u(r) = 0; \qquad (1)$$

where $Q(v(t)) \in R^n$ is a vector that represents the contribution of the dynamic elements such as inductors and capacitors, $I(v(t)) \in R^n$ is a vector representing static elements such as resistors, $u(t) \in R^n$ is a vector of inputs, and $v(t) \in R^n$ is a vector that contains state variables such as node voltages.

Distributed components—which are generally formulated in the frequency domain—are described using a more general form. Suppose that there are K linear, time-invariant, but distributed devices, each of which possesses a convolutional (impulse response) representation. Then the time domain circuit equations may be formulated as:

$$\frac{dQ(v(t))}{dt} + I(v(t)) + \left[\sum_{k=1}^{K} P_k \int_{-\infty}^{t} H_k(t-\tau) P_k^T v(\tau) d\tau\right] + u(t) = 0. \qquad (2)$$

Here $H_k: (-\infty, t] \to R^{p \times p_k}$ is the $p_k \times p_k$ matrix of impulse responses for the kth distributed component. It is related to the rest of the circuit equations via a matrix $P_k \in R^{n \times p}$, where the transpose of $P_k$, $P_k^T$, is an operator that extracts the relevant portion of the state vector. Thus, $P_k$ is one in the (i,j) entry if the jth connection to the kth device is through the state variable with index i, and zero otherwise. $P_k^T$ is an operator that extracts the relevant portion of the state vector.

In RF circuit simulation, the focus is typically on solving steady-state problems. The periodic, steady-state problem is the simplest and serves as a model for all the others. The periodic, steady-state solution is the solution of Equation (2) that also satisfies the two-point boundary condition $v(t+7)-v(t)=0$ for some period T and all time t. It is therefore sufficient to calculate the periodic, steady-state solution in the interval [0,T), i.e., the solution is some $v(t) \in [0,T) \times R^n$. This is useful because the (discrete) Fourier transform $Fv: Z \to C$, and its inverse $F^{-1}=F^*$—i.e., the inverse of the Fourier operator is the conjugate transpose of the operator—may be used in representing and manipulating signals. F, of course, maps v to its frequency domain representation, i.e., it produces the Fourier series coefficients.

Without loss of generality, a physically realizable distributed linear element can be represented as an N-port component described by an N×N frequency-dependent scattering S-parameter matrix. Since the convolution operation is diagonalized by the Fourier transform, the circuit equations can be written in terms of the frequency dependent matrix $H(\omega)$ as:

$$\frac{dQ(v(t))}{dt} + I(v(t)) + \left[\sum_{k=1}^{N} P_k F^* H_k(\omega) F P_k^T v\right] + u(t) = 0, \qquad (3)$$

where $H_k(\omega)$ is the (continuous) Fourier transform of the kth impulse response matrix.

C. CALCULATION OF THE FOURIER TRANSFORMS

The Fourier transforms 425 and 725—i.e., the Fourier coefficients—computed in both tiers of the two-tiered iterative approach, may be calculated in several different ways, depending on the embodiment used. Examples of calculation methods include the Fast Fourier Transform, the non-equispace Fourier transform, and the various quadrature methods. In a preferred embodiment the Chebyshev Fourier quadrature method is used by the simulation apparatus 100.

Chebyshev discretization—discussed below—achieves high accuracy with relatively few time points. Therefore, the Fourier transform and the inverse Fourier transform can be successfully applied to transform the waveforms between the frequency domain and time domain. The computational cost is at most $O(M^2)$, where M is the number of time steps.

For simplicity, consider the Chebyshev collocation method in a single interval—its application to multiple intervals is accomplished on an interval-by-interval basis. In order to use the frequency-dependent S-parameters directly, the time domain waveform is transformed into the frequency domain. Because the waveform is represented with high-order Chebyshev polynomials—as discussed below—Chebyshev quadrature formulas can be used to obtain the Fourier spectrum with high-order accuracy. The order of accuracy is essentially equal to the number of Chebyshev collocation points, i.e., the number of time steps in one Chebyshev time interval. Unlike low-order polynomial approximation methods such as the second-order Gear method, there is no loss of spectral accuracy in this process.

Assume that the time steps are $t_i$, where $i=0, \ldots, M$. Then the integration formula is $$\int_{t_0}^{t_M} v(t) dt = \sum_{i=1}^{M} w_i v(t_i), \quad \text{where}$$

$$w_i = \begin{cases} \dfrac{1}{M^2-1}, & i=0 \\ \dfrac{2}{M}\left(1 + \dfrac{(-1)^{(i-1)}}{M^2-1} + \sum_{k=1}^{\frac{M}{2}-1} \dfrac{2}{1-4k^2}\cos\left(2k\dfrac{\pi}{M}\right)\right), & i \leq \dfrac{M}{2} \\ w_{M-i}, & \dfrac{M}{2} < i \leq M \end{cases}$$

The function under consideration is periodic. Therefore, the Fourier spectrum can be calculated using the following formula:

$$\int_{t_0}^{t_M} v(t) e^{-jk\frac{2\pi}{T}t} dt = \sum_{i=0}^{M} w_i v(t_i) e^{-jk\frac{2\pi}{T}t_i},$$

where in keeping with engineering, as opposed to mathematical, notation, $j=\sqrt{-1}$.

With the Fourier spectrum known, the evaluation of the portion of the Jacobian due to the frequency-dependent elements can be performed in the frequency domain in the same fashion as in the harmonic balance method. The Jacobian matrix does not have to be formed explicitly. Instead, only the operation of multiplying the Jacobian by a given vector v—as done in Krylov-subspace iterative solvers such as GMRES—is done in the solution of the linear system. This operation is used in taking the matrix-vector product of the linear solver.

After the result of the operation is obtained in the frequency domain, it is transformed back to the time domain using the inverse Fourier transformation. The time domain simulation uses the result at the time points $t_i$, $i=0, \ldots, M$.

For these transformations, the levels of computational complexity of the multi-interval, Chebyshev method and traditional low-order methods are the same, and are generally proportional to the number of time points. Since the number of time points of the Chebyshev method is much smaller than that of traditional time domain methods, the Chebyshev method provides a significant advantage over even traditional low-order methods.

Since there are infinitely many Fourier coefficients for a given function, a choice is made on how many coefficients should actually be computed. This choice is significant because of the potential for aliasing errors. The general rule is that coefficients should be calculated only as far as the available data permits, and this is ultimately based on the number of time steps involved. Accuracy of the Fourier spectrum is quite satisfactory when M is at least 2 k, where M is the number of time points and k is the number of coefficients. As the ratio $$\frac{M}{k}$$

increases, so too does the accuracy of the spectrum. Thus, the finer the partition is, the greater the number of coefficients that can be calculated, which concomitantly increases the overall accuracy of the final solution.

D. THE TIME DOMAIN SOLUTION METHOD

In principle, any time domain method can be used to solve the system of equations. However, for traditional, low-order polynomial methods such as the second-order Gear method, the Fourier transformation step is expensive in the sense that it involves many calculations. Therefore, the preferred embodiment of the present invention uses a multi-interval, Chebyshev method as the time domain simulation method. This method has the advantage of preserving the accuracy of the frequency domain model description, and involves less computational time than traditional methods.

Returning to FIG. 2, in a preferred embodiment the simulation apparatus 100 partitions the time interval 205 using Chebyshev Gauss-Lobatto collocation points. These points are of the form $$t_j = \cos\left(\frac{\pi j}{M}\right),$$

$j=0, \ldots, M$. Next the simulator 100 produces an interpolating polynomial 210 based on the given values of u(t) evaluated at the collocation points. The interpolating polynomial is of degree M, and is formed using the standard Chebyshev polynomials, which are of the form: $T_k(t)=\cos(k \cos^{-1}(t))$, and which despite being defined in terms of the cosine and arc-cosine functions are actually expressible inductively as algebraic functions of the variable t.

If $u_k=u(t_k)$, then the interpolating polynomial has the form:

$$I_M u(t) = \sum_{k=0}^{M} u_k T_k(t). \tag{4}$$

Since the polynomial is a linear combination of Chebyshev polynomials, its derivative can be computed using the usual backwards recurrence relation for these polynomials. Thus, the derivative of the polynomial is:

$$(I_M u)'(t) = \sum_{k=0}^{M} u'_k T_k(t), \tag{5}$$

where the $u_k'$ are found from the $u_k$ by using the backward relations:

$u_M'=0$ $c_k u_k' = u_{k+2}' + 2(k+1) u_{k+1}, k=1, 2, \ldots, M-1$ $u_0' = u_2' + 2u_1 \tag{6}$ where $c_k=2$ when $k=0$ or M, and $c_k=1$ otherwise. The interpolating polynomial has the important property that its time derivative agrees with that of the solution to the differential equation at each collocation point.

The differentiation matrix D can be obtained by expressing the interpolating polynomial in terms of Lagrange interpolating polynomials, $g_j(t)$, and setting $$D_{kj} = \frac{dg_j}{dt}(t_k).$$

Then the differentiation matrix is $D=(D_{kj})$. The entries of the matrix are also expressible as:

$$D_{kj} = \frac{c_k (-1)^{j+k}}{c_j (t_k - t_j)}, \qquad j \neq k \tag{7}$$

$$D_{kk} = -\frac{t_k}{2(1-t_k^2)}, \qquad k \neq 0, M$$

$$D_{00} = -D_{MM} = \frac{2M^2 + 1}{6},$$

where, as before, $c_k=2$ when $k=0$ or M, and $c_k=1$ otherwise.

Although the preferred embodiment described above makes use of Chebyshev polynomials, other types of orthogonal polynomials can be used, such as, for example, Legendre polynomials. In fact, one of ordinary skill in the art will appreciate that an arbitrary collection of time domain basis functions can be used without departing from the spirit of the present invention. However, in a preferred embodiment the functions will be basis elements from a complete orthonormal basis for $L^2$ of the appropriate measure space.

As in the classical harmonic balance method, a high degree of accuracy is achievable because in each approximation interval all of the usual desirable properties of Chebyshev polynomials can be exploited.

One approach for the next step is to compute the Jacobian matrix in preparation for applying Newton's method 215. However, in one embodiment only an implicit representation of the Jacobian is used—the actual Jacobian matrix does not have to be constructed explicitly. Iteration is then performed with a decision made at each iteration: if the error is greater than some preset tolerance 325, then another iteration is performed 330. Otherwise, if the error is within the tolerance 315, the solution is given as an output 320.

A significant feature of the present embodiment is the fact that there are actually two sets of iterations being performed. First, there are the iterations directly associated with Newton's method 215. Second, there are the iterations directly associated with the Krylov subspace solver 515. The Krylov subspace solver iterations 515 can be viewed as nested within the Newton's method 215 iterations, with the Krylov subspace solver output 625 serving as the updated input for Newton's method 215. Ultimately, it is the combination of these two iterative procedures that produces the solution to the system of equations.

A difficulty in applying Newton's method 215 lies in inverting the Jacobian, since the general iteration formula is of the form:

$$X_{n+1} = X_n - J_F(X_n)^{-1} F(X_n) \qquad (8)$$

where $X_j$ is the jth approximation to the solution of $F(X)=0$, and $J_F$ is the Jacobian matrix of F. In addition, in the nonlinear, steady-state computation, a system is solved at each step of Newton's method 215.

FIG. 5 shows how a preferred embodiment obviates this difficulty in the operation of the Krylov iterative subspace solver 515—the lower iteration tier—by decomposing the Jacobian matrix 505 into three pieces: a dynamic piece, $J_C$, a static piece, $J_G$, and a distributed piece, $J_D$. Using this decomposition 505, the simulator 100 constructs a preconditioner 510 to accelerate the convergence of the iterations, while applying a matrix-implicit, Krylov subspace iterative solver 515. As previously discussed, in the Krylov loop 515 an error term is calculated based on the result 615 produced by the solver 515. If the error is less than a preset tolerance 620, the result is given as an output 625 used in the next Newton's method loop 215. Otherwise another iteration is performed 635.

With the Chebyshev discretization—i.e., the development of the Chebyshev interpolating polynomial—the difficult task of solving the large linear systems generated from the circuit Jacobian matrix is facilitated using $$G(t_k) = \frac{\partial I}{\partial v}\bigg|_{v(t_k)}, \quad C(t_k) = \frac{\partial Q}{\partial v}\bigg|_{v(t_k)} \qquad (9)$$

to produce the following expression for the dynamic piece of the Jacobian:

$$J_C = \begin{bmatrix} D^1 \otimes I^1 & \cdots & & D_0^1 \otimes I^1 \\ & \ddots & & \\ & & D^2 \otimes I^2 & D_0^2 \otimes I^2 \\ & & & \ddots \end{bmatrix} \begin{bmatrix} C(t_1) & & & \\ & C(t_2) & & \\ & & C(t_3) & \\ & & & \ddots \end{bmatrix} \qquad (10)$$

where $D^k$ is that part of the Chebyshev differentiation matrix, D, that is in the kth interval ($[D_{ij}]|_{i,j=1,\ldots,M}$), $D_0^k{}_{is([D_{ij}]|_{i=1,\ldots,M;\ j=0})}$, and $I^k$ is the identity matrix of dimension equal to the number of time points in the kth interval. Corresponding expressions for the static and distributed pieces are:

$$J_G = \begin{bmatrix} G(t_1) & & & \\ & G(t_2) & & \\ & & G(t_3) & \\ & & & \ddots \end{bmatrix} \text{ and } J_D = \left[ \sum_{k=1}^{N} P_k F^* H_k(\omega) F P_k^T \right] \qquad (11)$$

In small signal and noise analysis, a related system is solved at each frequency point of analysis. Because of the frequency dependent property of the distributed components, the transformation F is dependent on all time points in the simulation time interval. It follows from the form of Equation (3), that every p-port distributed element introduces p rows and columns that are full, into the Jacobian. This can be seen by noting that the matrices P, F*, and $FP^T$ are dense. It is not possible to form and solve large systems of such a form efficiently using direct linear algebra. Instead, as previously stated, a preferred embodiment of the present invention uses a Krylov subspace iterative solver such as GMRES.

Preferred embodiments of the present invention treat the distributed components as "black boxes" in a matrix-implicit context. Therefore, the actual Jacobian matrix does not have to be formed explicitly. Thus, for example, these embodiments evaluate the term, $J_D$, by taking time domain waveforms as input, applying the Fourier transformation to transform them into the frequency domain, applying the transfer function of the distributed components—in terms of frequency-dependent S-parameters—to the frequency domain result, and inverse-transforming to the time domain.

This procedure has at least as much flexibility in dealing with distributed components as the standard harmonic balance method does. In fact, there is greater flexibility. Any part of the transfer function which is best suited to evaluation in the time domain can be extracted, and that part of the port-to-port transformation can be performed in the time domain. For example, the delay transformation of transmission lines can be performed in the time domain. This produces much more accurate results than can possibly be obtained by representing the delay using solely a sum of Fourier harmonics. All these operations fit in the matrix-vector product calculation of iterative solvers. Therefore, they may be done without forming a complex Jacobian matrix explicitly.

Denote the Jacobian matrix of A and B as $J_A$ and $J_B$, respectively. Iterative solvers calculate $v_1 = J_A \cdot v$ and $v_2 = J_B \cdot v$, where v is the corresponding part of the solution vector, and then calculate $v_1+v_2$ 740, which is part of the matrix-vector product evaluation 610.

Rapid convergence of the Krylov-subspace iterative method 515 involves the construction of effective preconditioners 510. Shooting-based time domain RF circuit simulation methods construct the preconditioners 510 by using the fact that the block-lower-triangular portion of the Jacobian is easily inverted, since the diagonal blocks can be efficiently factored via sparse direct techniques. That is, to solve the preconditioned system $P^{-1} J_X = P^{-1} b$, the Jacobian is first decomposed into upper- and lower-block triangular pieces, J=L+U, with $$U = \begin{bmatrix} 0 & D_0^1 \otimes I^1 \\ & \ddots \\ & & 0 \end{bmatrix} \begin{bmatrix} C(t_1) \\ & C(t_2) \\ & & C(t_3) \\ & & & \ddots \end{bmatrix} \quad (12)$$

and $L = \tilde{J}_C + J_G$, where $$\tilde{J}_C = \begin{bmatrix} D^1 \otimes I^1 \\ & \ddots \\ D_0^2 \otimes I^2 & D^2 \otimes I^2 \\ & & \ddots \end{bmatrix} \begin{bmatrix} C(t_1) \\ & C(t_2) \\ & & C(t_3) \\ & & & \ddots \end{bmatrix} \quad (13)$$

The preconditioner 510 is then $P = \tilde{J}_C + J_G = L$. As P is a block-lower-triangular matrix, inversion is easily performed as long as the diagonal blocks can be factored or inverted efficiently, which is the case here. The reason that there are possible problems with applying a similar technique when distributed elements are present is because of the term $J_D$. In the matrix-implicit context it is difficult to construct the lower-diagonal piece or to invert it.

In general, solutions at the nodes of the distributed components are coupled in time because of the Fourier transformation done in the periodic time interval. Existing preconditioning techniques for periodic steady-state simulation can not solve this difficulty. However, preferred embodiments of the present invention solve this problem using low-order lumped models to construct the distributed part of the preconditioner 510.

The first step in the preconditioning strategy of a preferred embodiment is to construct an approximate $\tilde{H}(\omega)$ that is close to $H(\omega)$. One possibility in constructing an approximate $\tilde{H}(\omega)$ is to use a rational approximation of the underlying device parameters $S(\omega)$. A preferred embodiment of the present invention constructs a rational approximation $\tilde{S}(\omega)$ of $S(\omega)$. Since the rational approximation will only be used as a preconditioner 510, it does not have to be extremely accurate. Therefore, $S(\omega)$ may be approximated with a low-order model, which is relatively cheap to construct. This approach has the advantage that the block-lower-triangular preconditioners previously discussed may be used.

Constructing a rational function model is equivalent to finding a state-space model of the form:

$$\frac{dx}{dt} = Ax + Bu(t), \quad y = Cx + Du \quad (14)$$

such that the transfer function, $S(\omega) = D + C(i\omega I - A)^{-1} B$, approximates $S(\omega)$. This is accomplished by requiring that the mean-squared error, $$E = \sum_k W(\omega_k)^2 \|\tilde{S}(\omega_k) - S(\omega_k)\|_2, \quad (15)$$

is minimized. In the above, $W(\omega_k)$ represents the weighting at frequency point k for the least-squares minimization.

Ideally, the preconditioner 510 should be $P = \tilde{J}_C + J_G + \tilde{J}_D$, where $$\tilde{J}_D = \left[ \sum_{k=1}^{N} P_k F^* \tilde{H}_k(\omega) F P_k^T v. \right] \quad (16)$$

Unfortunately, even with the rational model technique, matrices of this form may not be inverted efficiently. However, since state-space models have finite-dimensional state spaces, the rational function models may be included in an extended version of the circuit equations. The extended circuit equations will include the states of the rational fitting model, and so the Jacobian of the extended system will agree with the Jacobian of the original system, treating the distributed component as the rational fitting model.

Adopting the J, L, U notation, let $$J_R = L_R + U_R \quad (17)$$

be the Jacobian for the circuit equations including the rational fitting model, where R denotes the rational fitting, and $L_R$ and $U_R$ denote the upper and lower block-triangular pieces, respectively, as defined above. If there are M time steps in the Chebyshev discretization of the periodic interval, and n circuit equations, then $J \in R^{Mn \times Mn}$, but $J_R \in R^{M(n+q) \times M(n+q)}$, where q is the total number of additional state space variables introduced by the rational approximation of the frequency response of all the distributed components. Thus, the answer is not as simple as just writing $P = L_R$, since $L_R$ and J have different dimensions.

Preferred embodiments of the present invention solve this problem by defining an operator, $Q: R^{Mn} \to R^{M(n+q)}$, that embeds the Mn dimensional space into the M(n+q) dimensional one. The operator is an identity embedding represented by a section of the identity matrix. $Q^T$, the transpose of Q, likewise extracts the original state space from the extended one. In essence, $Q^T$ projects the larger space onto the smaller space, and has kernel equal to the orthogonal complement of the subspace of original state space variables. The relationship that the Jacobian of the extended system has to the Jacobian of the original system—treating the distributed component as the rational fitting model—can be expressed as:

$$J = Q^T J_R Q. \quad (18)$$

In order to use $L_R$ as the preconditioner 510 for the Jacobian, $J, Q^T$ can be used to extract the relevant components, so that $$P^{-1} = Q^T L_R^{-1} Q. \quad (19)$$

The inverse of $L_R$ can be easily computed because it is a block lower-triangular system. Moreover, the preconditioner 510 will also include an approximation to H. If the rational fitting model is a fairly good approximation of the original system, then the GMRES solver will be efficient whenever the block-lower-triangular strategy is also effective.

Because the rational model is used solely as a preconditioner 510, its accuracy does not affect the accuracy of the final solution. If the rational approximation were used to construct an equivalent lumped model instead of evaluating the distributed components, the rational model would have to very closely track the frequency response, meaning that it would often be of a very high order. In addition, physical constraints—such as passivity—would have to be introduced into the rational model. Such constraints are computationally expensive to enforce for high-order, multi-port models. Indeed, both the model generation process, and the later time domain simulation, would be more computationally expensive than the strategy used in preferred embodiments of the present invention. These embodiments only use rational approximations of orders say two or three to give effective preconditioners 510.

In accordance with another embodiment, a computer program product for accurately and efficiently simulating a circuit is provided. It can be used to simulate a circuit so that on the one hand steady-state time domain analysis can be applied, while on the other hand the distributed passive components of the circuit—i.e., those with an infinite dimensional state space—can also be simulated. A preferred embodiment can be used in the apparatus 100 described above, and the discussion of the computer program product parallels that of the apparatus 100.

Figure 8:
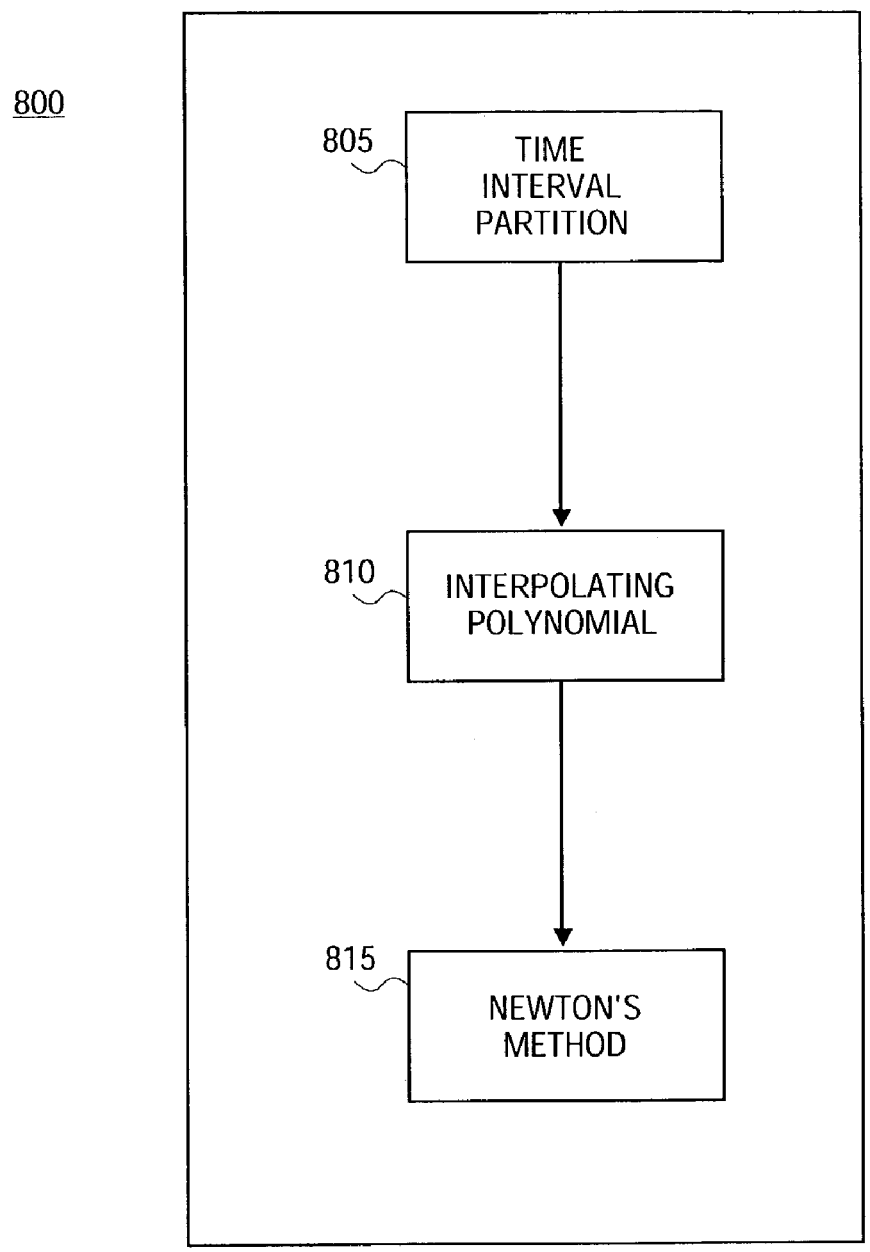
FIG. 8 is a flow chart of the steps a computer program product uses for performing circuit simulation.

The computer program product produces a mathematical model of the circuit. This model is in the form of an appropriate system of equations. The computer program product uses a two-tiered iterative approach to solving the system of equations. FIG. 8 is a flow chart depicting an overview of how the computer program product 800 solves the system of equations to simulate the circuit. As discussed in detail above in the disquisition on the apparatus 100, the computer program product 800 partitions a time interval 805 on which the system of equations is defined, and produces an interpolating polynomial 810 on the interval. The interpolating polynomial 810 provides an initial approximation to the solution, and is used in an iterative method to generate the next approximation. A preferred iterative method is Newton's method 815, and it serves as the top tier of the two-tiered iteration approach used by the computer program product 800.

Figure 9:
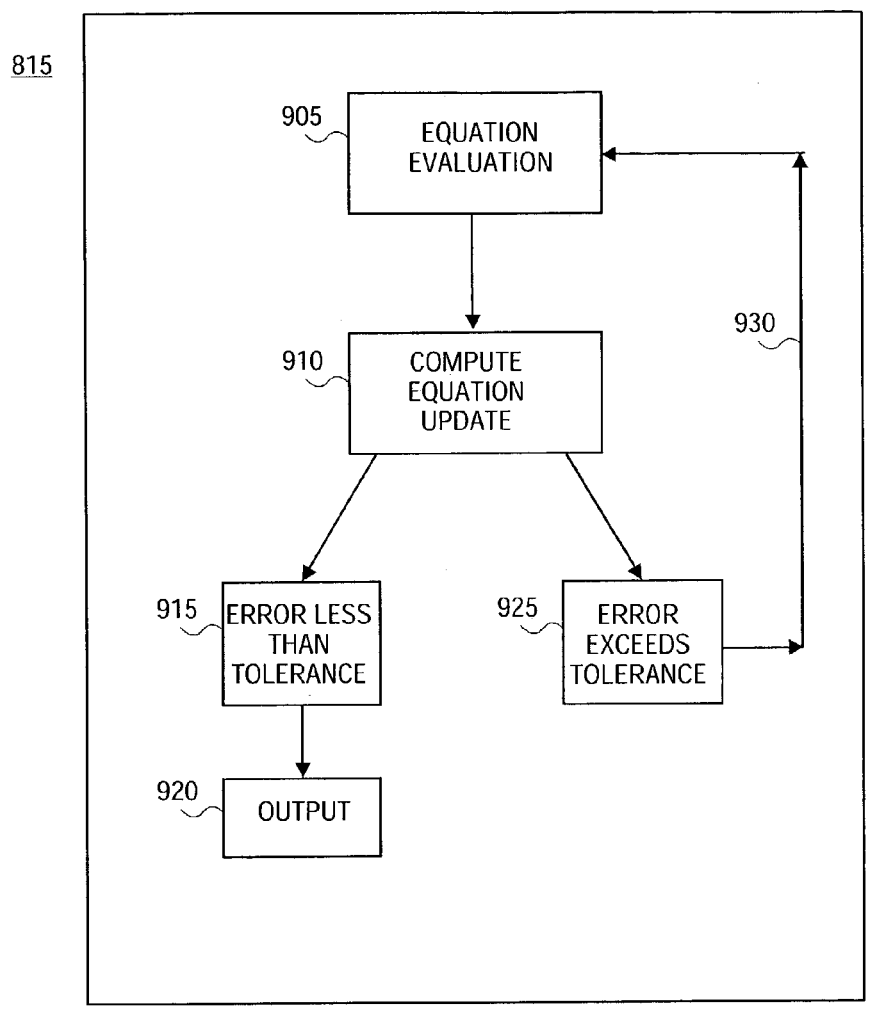
FIG. 9 is a flow chart of the Newton's method step in FIG. 8, performed by the computer program product in simulating a circuit.

FIG. 9 is a flow chart showing the implementation of Newton's method 815 to generate the next approximation, and ultimately a solution to the system of equations. The most recent approximation is evaluated in the appropriate iterative equation 905. The result is used to update the equation 910 and an error term is calculated. The error term is compared to a preset tolerance. If the error exceeds the tolerance 925 another iteration is performed 930. Otherwise, if the error is less than the tolerance 915 the iteration stops and the solution is provided as an output 920.

Figure 10:
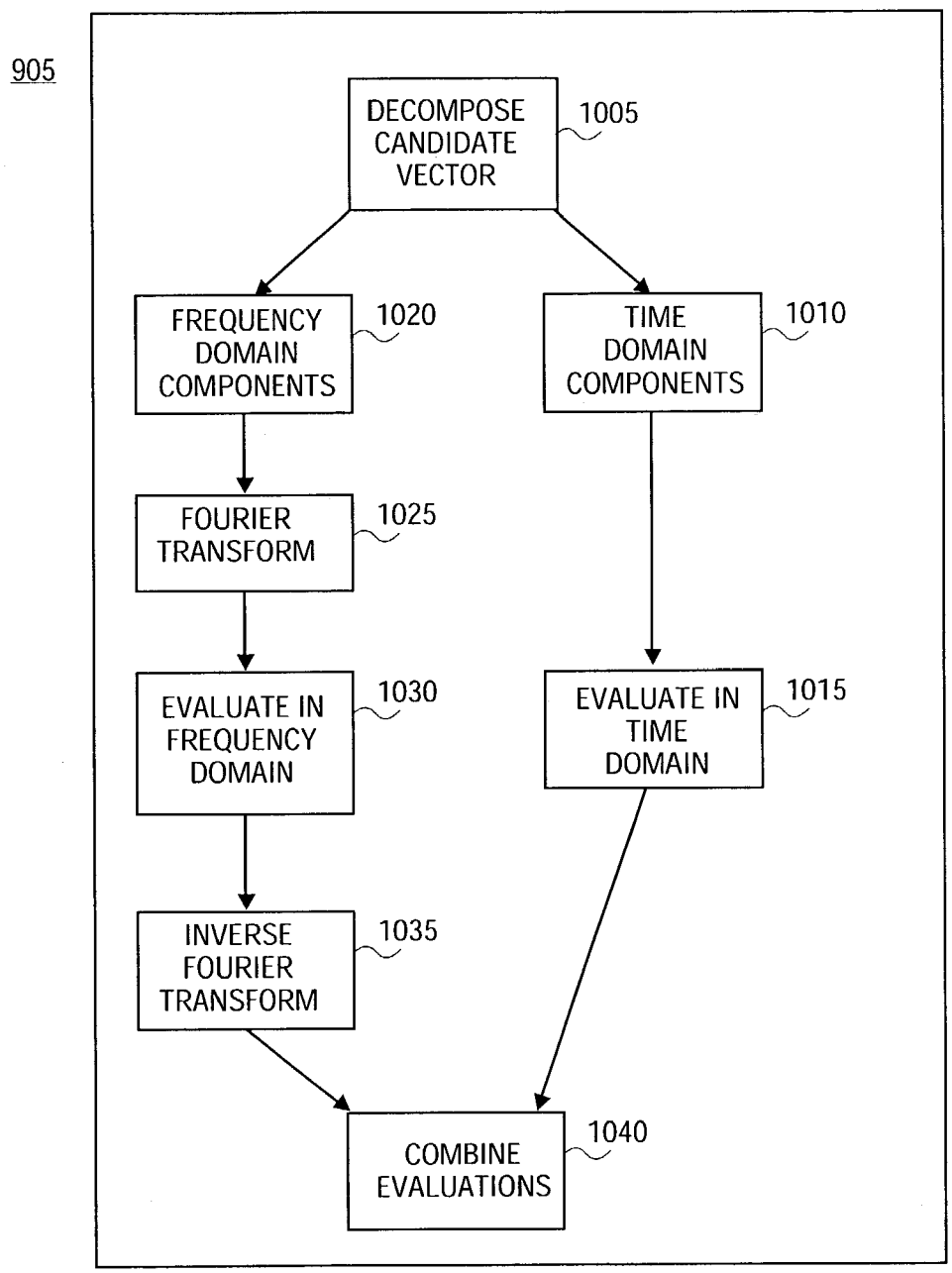
FIG. 10 is a flow chart of the equation evaluation step in FIG. 9, as performed by the computer program in simulating a circuit.

The equation evaluation step 905 of FIG. 9 is shown in greater detail in FIG. 10, which is a flow chart of the evaluation step 905. The candidate solution vector is decomposed 1005 into its frequency domain components 1020 and its time domain components 1010. The computer program product 800 takes the Fourier transform 1025 of the frequency domain components, evaluates the result in the frequency domain 1030, and then takes the inverse Fourier transform 1035 of the evaluation. Meanwhile, the apparatus evaluates the time domain components in the time domain 1015. The inverse Fourier transformed evaluation 1035 is then combined with the time domain evaluation 1015 to produce the equation evaluation 905.

Figure 11:
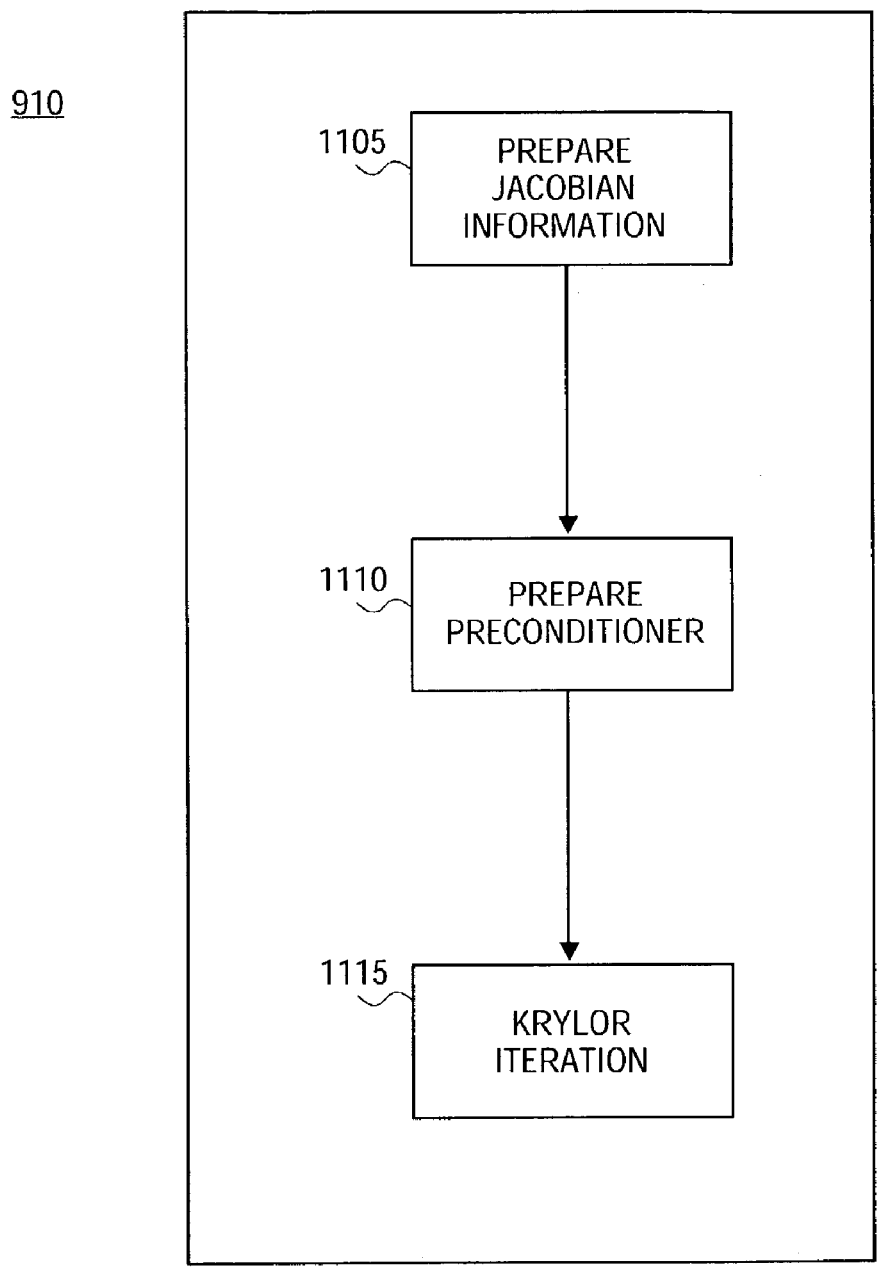
FIG. 11 is a flow chart of the equation update step in FIG. 9, as performed by the computer program product in simulating a circuit.

FIG. 11 is a flow chart of the equation update step 910 of FIG. 9, i.e., of Newton's method 815 (or other suitable iterative method). The computer program product prepares information on the Jacobian matrix 1105 used in the iterations of Newton's method 815. It also prepares a preconditioner 1110 to help speed up convergence to the solution. It then performs the lower tier iteration, which in a preferred embodiment uses a Krylov iterative subspace solver 1115, as discussed in detail above in the disquisition on the apparatus 100.

Figure 12:
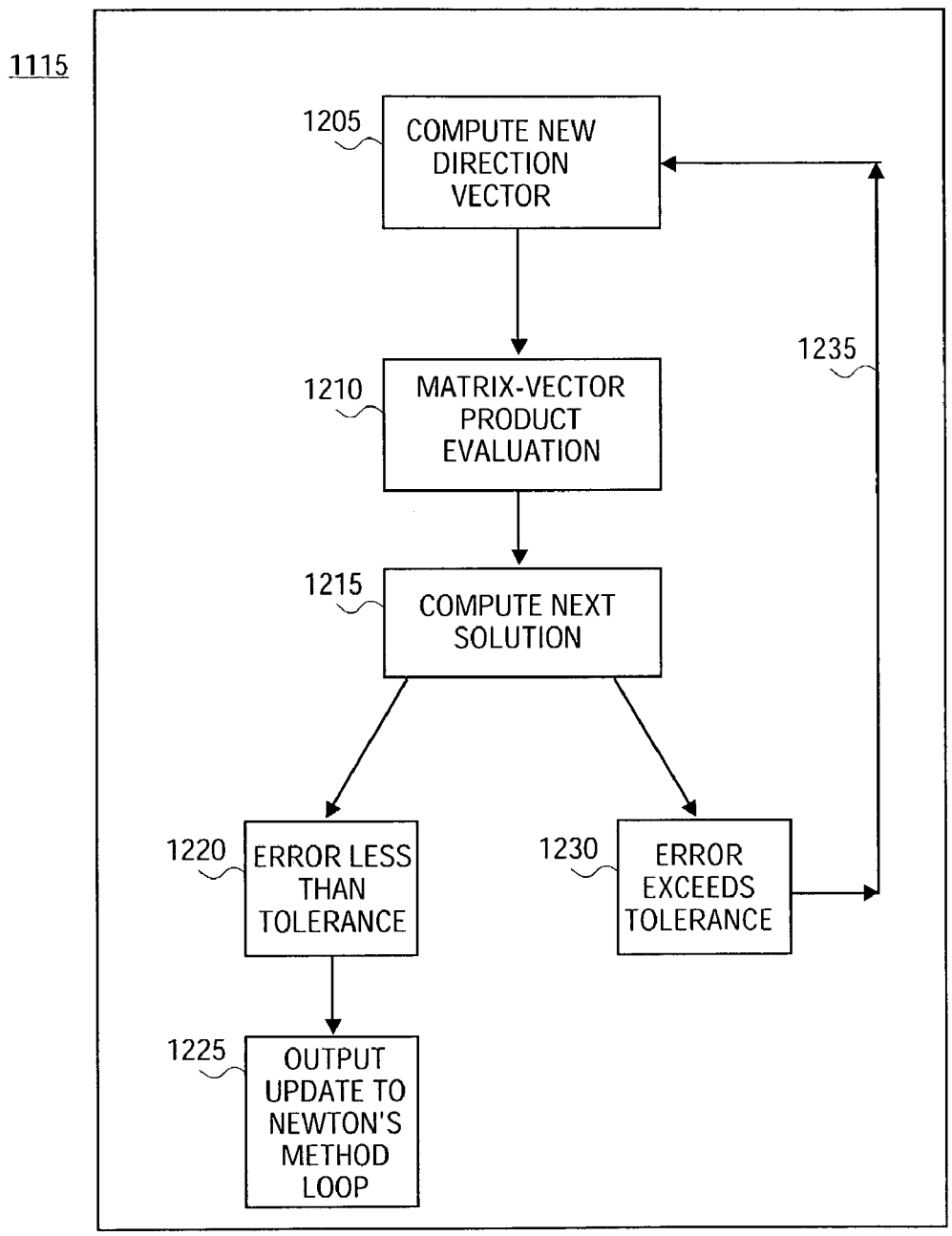
FIG. 12 is a flow chart of the Krylov iteration step in FIG. 11, as performed by the computer program product in simulating a circuit.

FIG. 12 is a flow chart of the Krylov iterative subspace solver 1115 of FIG. 11. The Krylov solver 1115 computes a new direction vector 1205, and uses it to compute a matrix-vector product evaluation 1210 that is part of this lower tier iteration. The result of this evaluation 1210 is used to compute the next solution approximation 1215. An error term is calculated and compared to a preset tolerance that can—but need not necessarily—be the same as the tolerance used in the top tier iteration discussed above. If the error exceeds the tolerance 1230, another iteration is performed 1235. Otherwise the solution is provided as an output to be used to update 1225 next iteration of the Newton's method loop 910 in FIG. 9.

Figure 13:
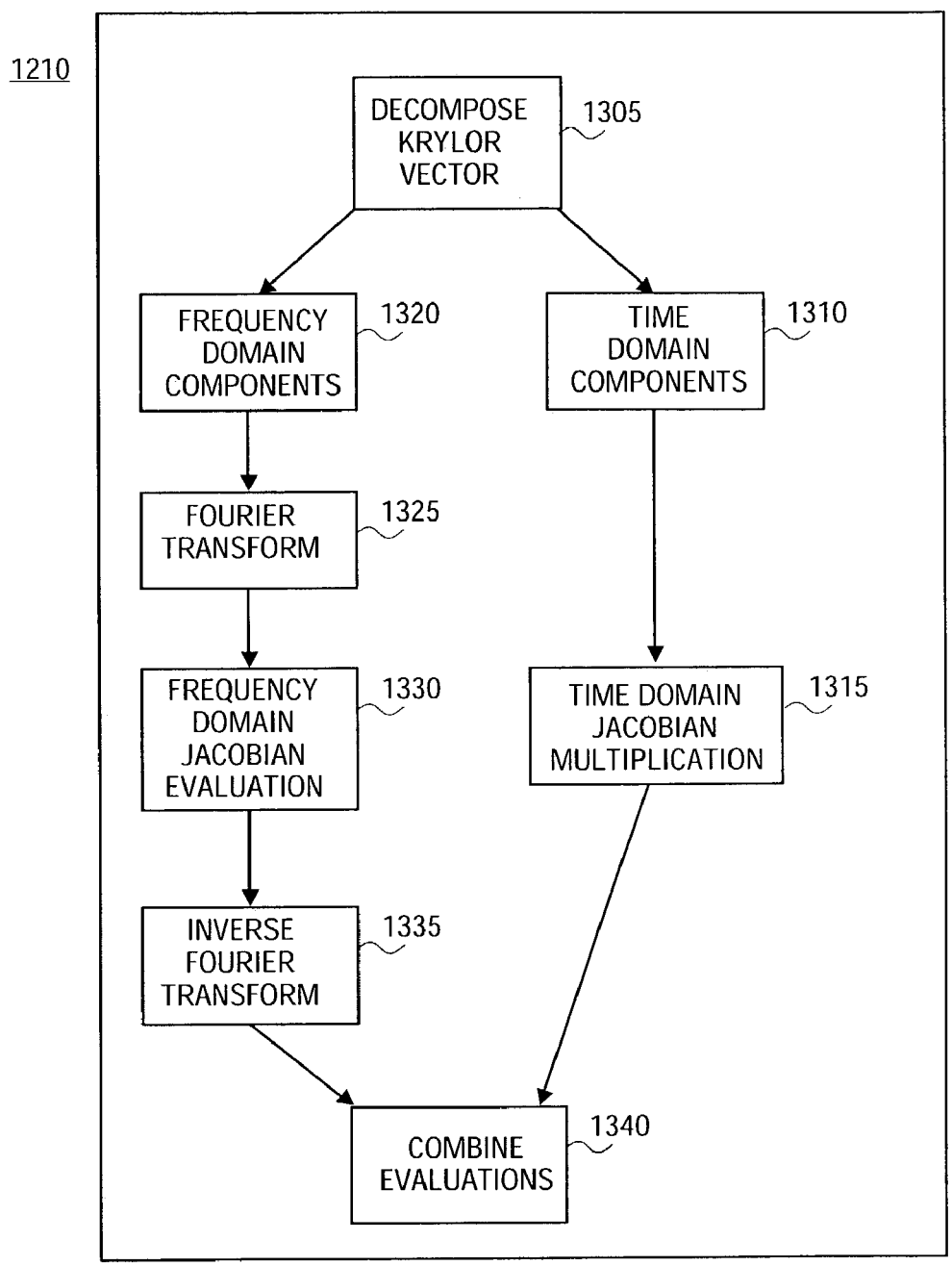
FIG. 13 is a flow chart of the matrix-vector product evaluation step in FIG. 12, as performed by the computer program product in simulating a circuit.

FIG. 13 is a flow chart of the matrix-vector product evaluation 1210 step of FIG. 12. The Krylov subspace vector is decomposed 1305 into its frequency domain components 1320 and its time domain components 1310. The computer program product 800 takes the Fourier transform 1325 of the frequency domain components 1320, performs a frequency domain Jacobian matrix evaluation 1330 on the result, and then takes the inverse Fourier transform 1335 of the evaluation 1330. The computer program product 800 also performs a time domain Jacobian matrix multiplication 1315 using the time domain components 1310. The result of this multiplication 1315 is combined with the inverse Fourier transform 1335 of the frequency domain evaluation 1330 to produce the next Krylov solution approximation 1215.

In accordance with another embodiment, a method for accurately and efficiently simulating a circuit is provided. It can be used to simulate a circuit so that on the one hand steady-state time domain analysis can be applied, while on the other hand the distributed passive components of the circuit—i.e., those with an infinite dimensional state space—can also be simulated.

In accordance with another embodiment, a method for accurately and efficiently simulating a circuit is provided. It can be used to simulate a circuit so that on the one hand steady-state time domain analysis can be applied, while on the other hand the distributed passive components of the circuit—i.e., those with an infinite dimensional state space—can also be simulated. A preferred embodiment can be implemented using in the apparatus 100 described above, and the discussion of the method parallels that of the apparatus 100.

Figure 14:
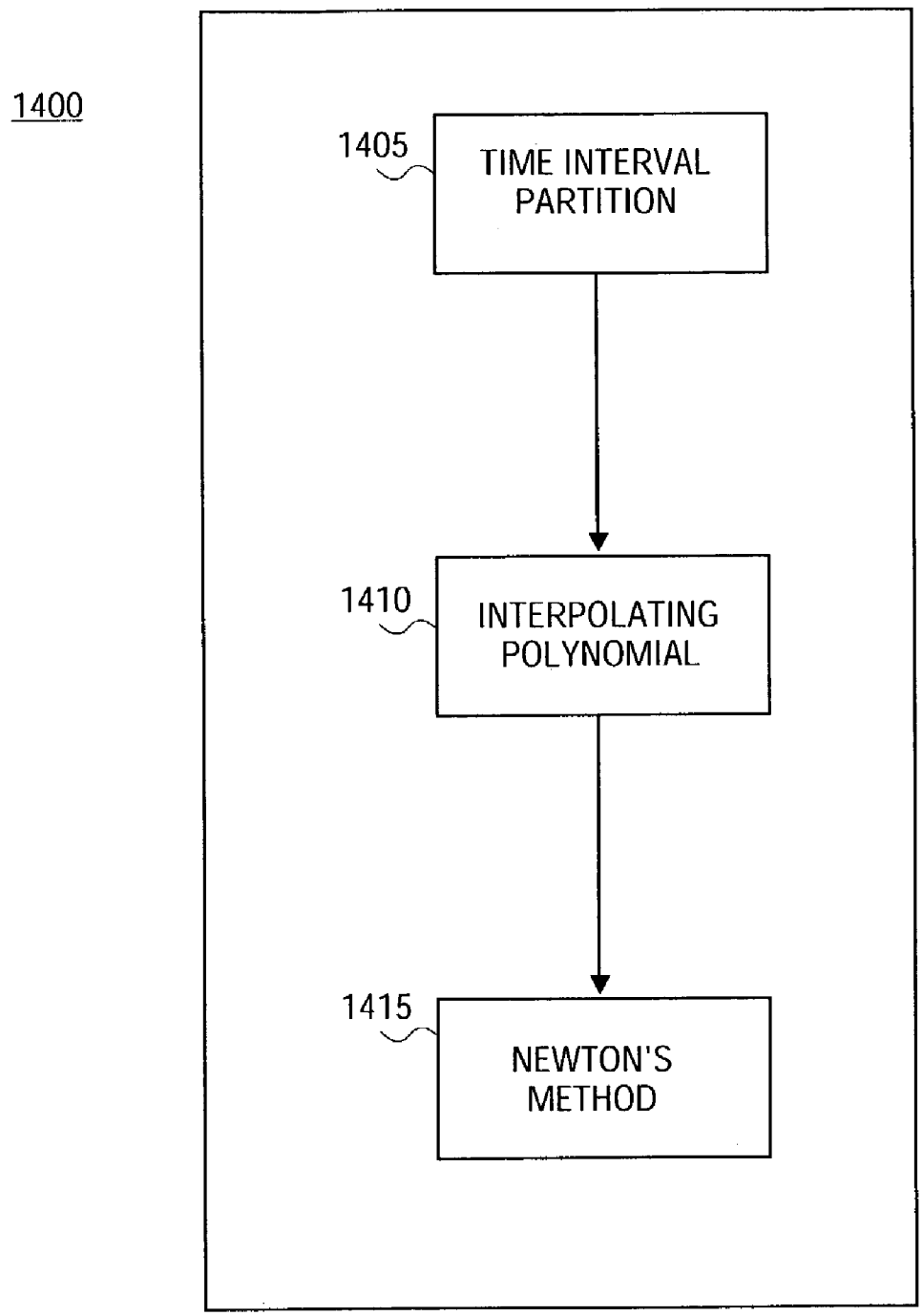
FIG. 14 is a flow chart of the steps of a method for performing circuit simulation.

The method produces a mathematical model of the circuit. This model is in the form of an appropriate system of equations. The method uses a two-tiered iterative approach to solving the system of equations. FIG. 14 is a flow chart depicting an overview of how the method 1400 solves the system of equations to simulate the circuit. As discussed in detail above in the disquisition on the apparatus 100, the method 1400 partitions a time interval 1405 on which the system of equations is defined, and produces an interpolating polynomial 1410 on the interval. The interpolating polynomial 1410 provides an initial approximation to the solution, and is used in an iterative method to generate the next approximation. A preferred iterative method is Newton's method 1415, and it serves as the top tier of the two-tiered iteration approach used by the method 1400.

Figure 15:
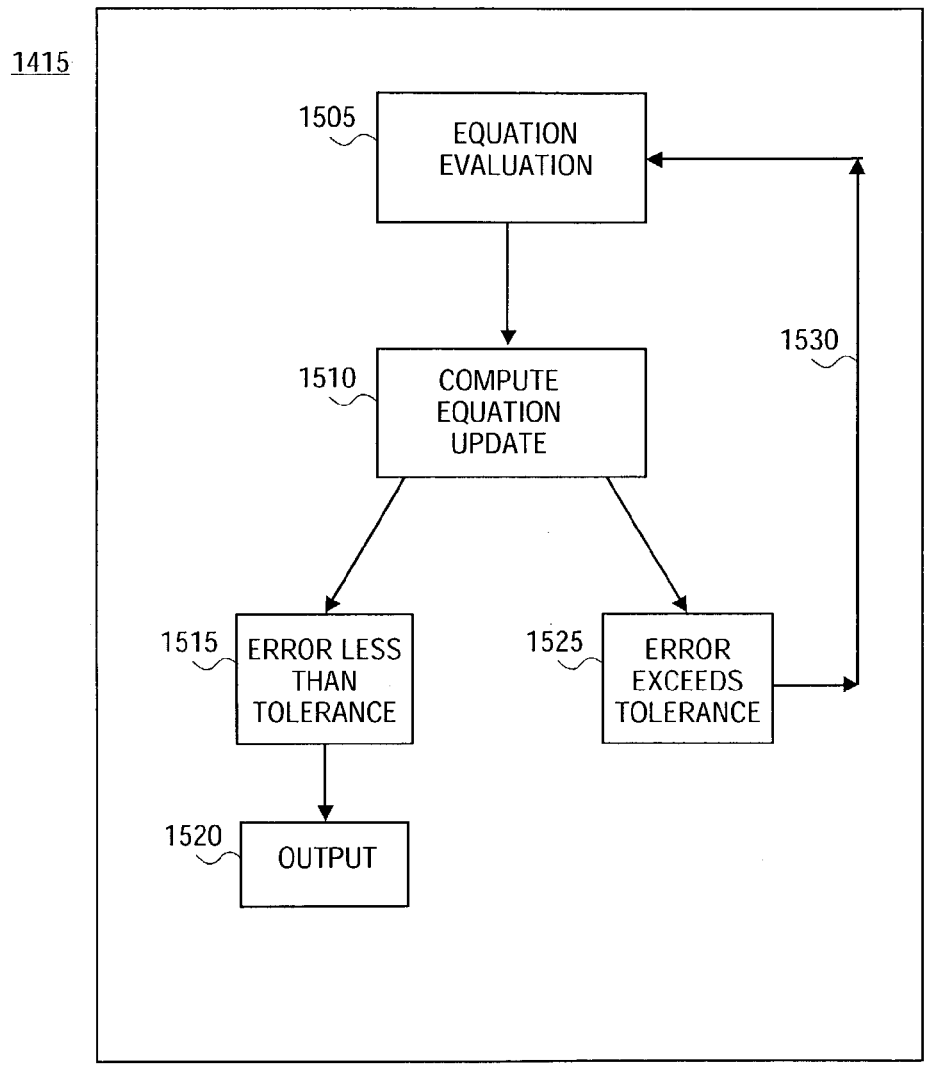
FIG. 15 is a flow chart of the Newton's method step in FIG. 14, used in the method of simulating a circuit.

FIG. 15 is a flow chart showing the implementation of Newton's method 1415 to generate the next approximation, and ultimately a solution to the system of equations. The most recent approximation is evaluated in the appropriate iterative equation 1505. The result is used to update the equation 1510 and an error term is calculated. The error term is compared to a preset tolerance. If the error exceeds the tolerance 1525 another iteration is performed 1530. Otherwise, if the error is less than the tolerance 1515 the iteration stops and the solution is provided as an output 1520.

Figure 16:
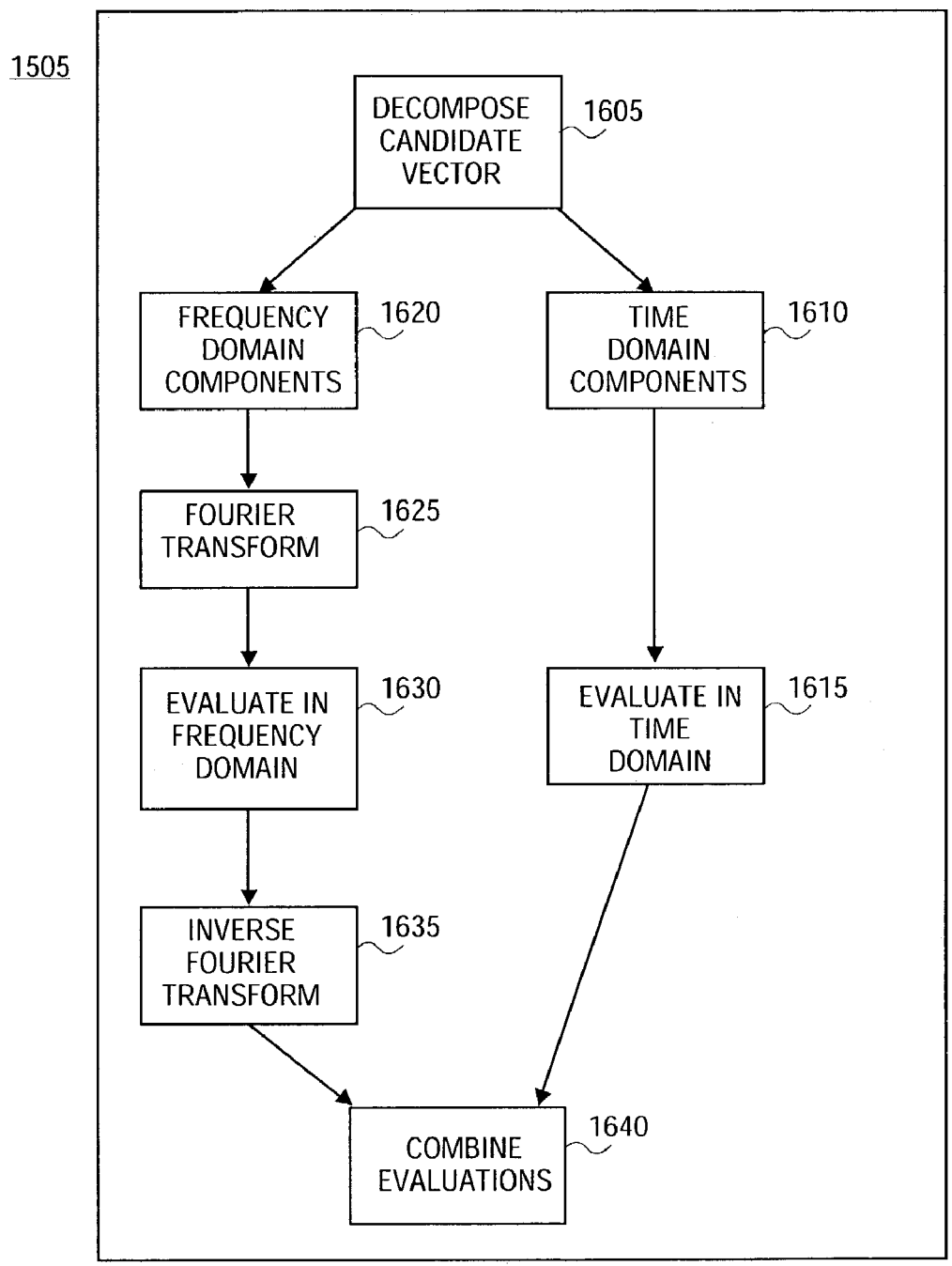
FIG. 16 is a flow chart of the equation evaluation step in FIG. 15, used in the method of simulating a circuit.

The equation evaluation step 1505 of FIG. 15 is shown in greater detail in FIG. 16, which is a flow chart of the evaluation step 1505. The candidate solution vector is decomposed 1605 into its frequency domain components 1620 and its time domain components 1610. The method 1400 takes the Fourier transform 1625 of the frequency domain components, evaluates the result in the frequency domain 1630, and then takes the inverse Fourier transform 1635 of the evaluation. Meanwhile, the apparatus evaluates the time domain components in the time domain 1615. The inverse Fourier transformed evaluation 1635 is then combined with the time domain evaluation 1615 to produce the equation evaluation 1505.

Figure 17:
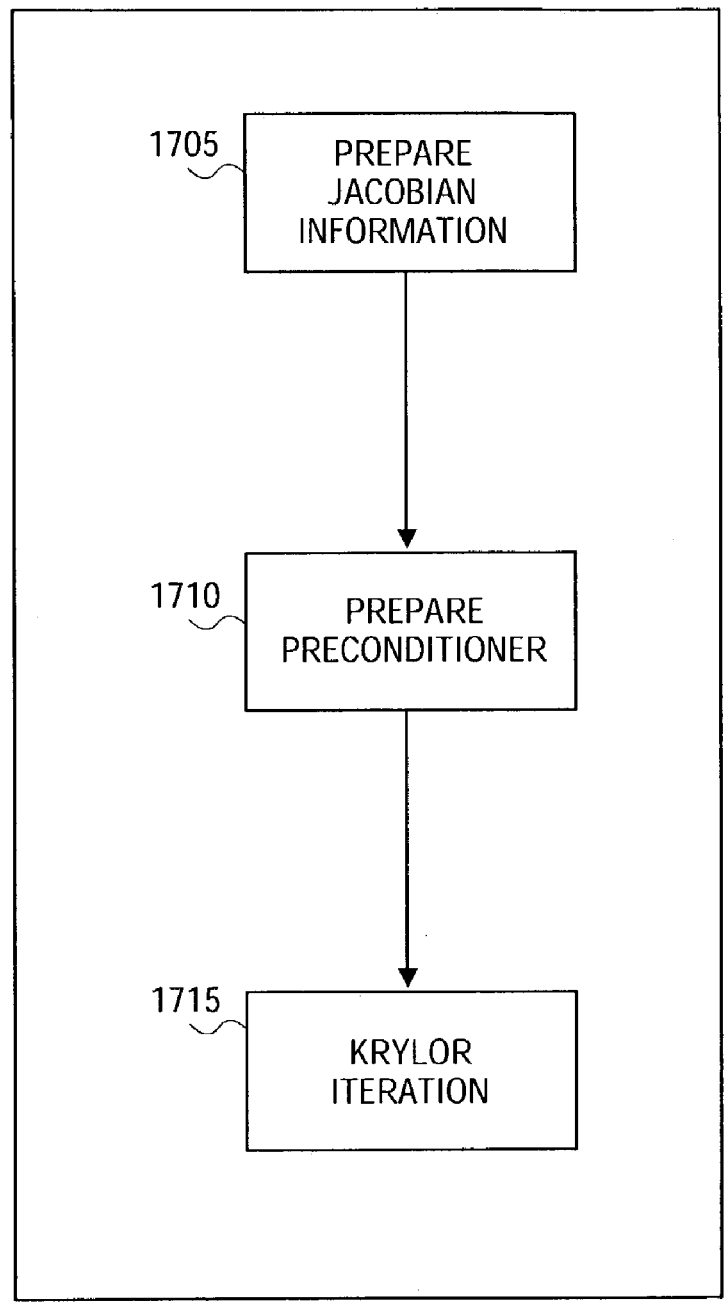
FIG. 17 is a flow chart of the equation update step in FIG. 15, used in the method of simulating a circuit.

FIG. 17 is a flow chart of the equation update step 1510 of FIG. 15, i.e., of Newton's method 1415 (or other suitable iterative method). The computer program product prepares information on the Jacobian matrix 1705 used in the iterations of Newton's method 1415. It also prepares a preconditioner 1710 to help speed up convergence to the solution. It then performs the lower tier iteration, which in a preferred embodiment uses a Krylov iterative subspace solver 1715, as discussed in detail above in the disquisition on the apparatus 100.

Figure 18:
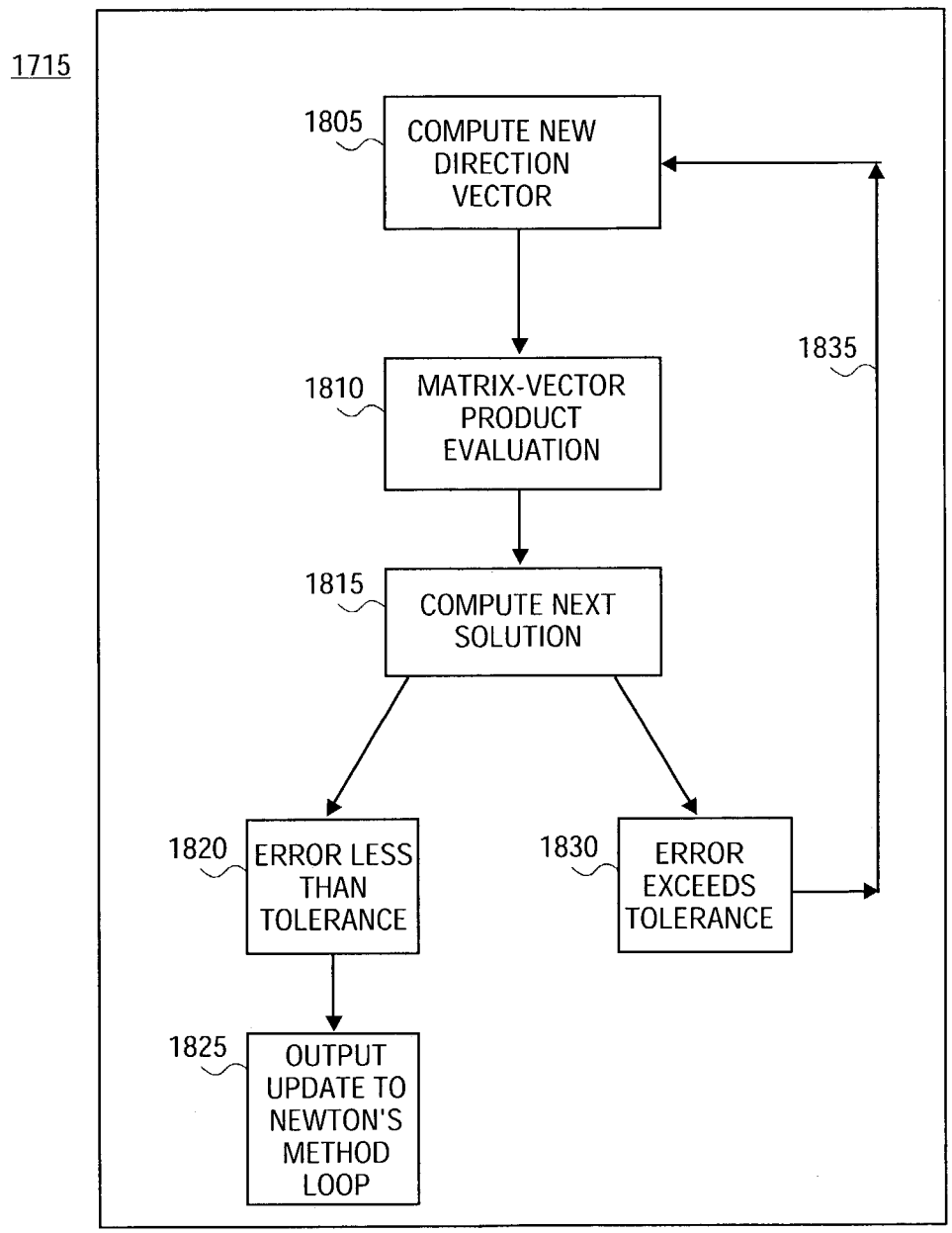
FIG. 18 is a flow chart of the Krylov iteration step in FIG. 17, used in the method of simulating a circuit.

FIG. 18 is a flow chart of the Krylov iterative subspace solver 1715 of FIG. 17. The Krylov solver 1715 computes a new direction vector 1805, and uses it to compute a matrix-vector product evaluation 1810 that is part of this lower tier iteration. The result of this evaluation 1810 is used to compute the next solution approximation 1815. An error term is calculated and compared to a preset tolerance that can—but need not necessarily—be the same as the tolerance used in the top tier iteration discussed above. If the error exceeds the tolerance 1830, another iteration is performed 1835. Otherwise the solution is provided as an output to be used to update 1825 next iteration of the Newton's method loop 1510 in FIG. 15.

Figure 19:
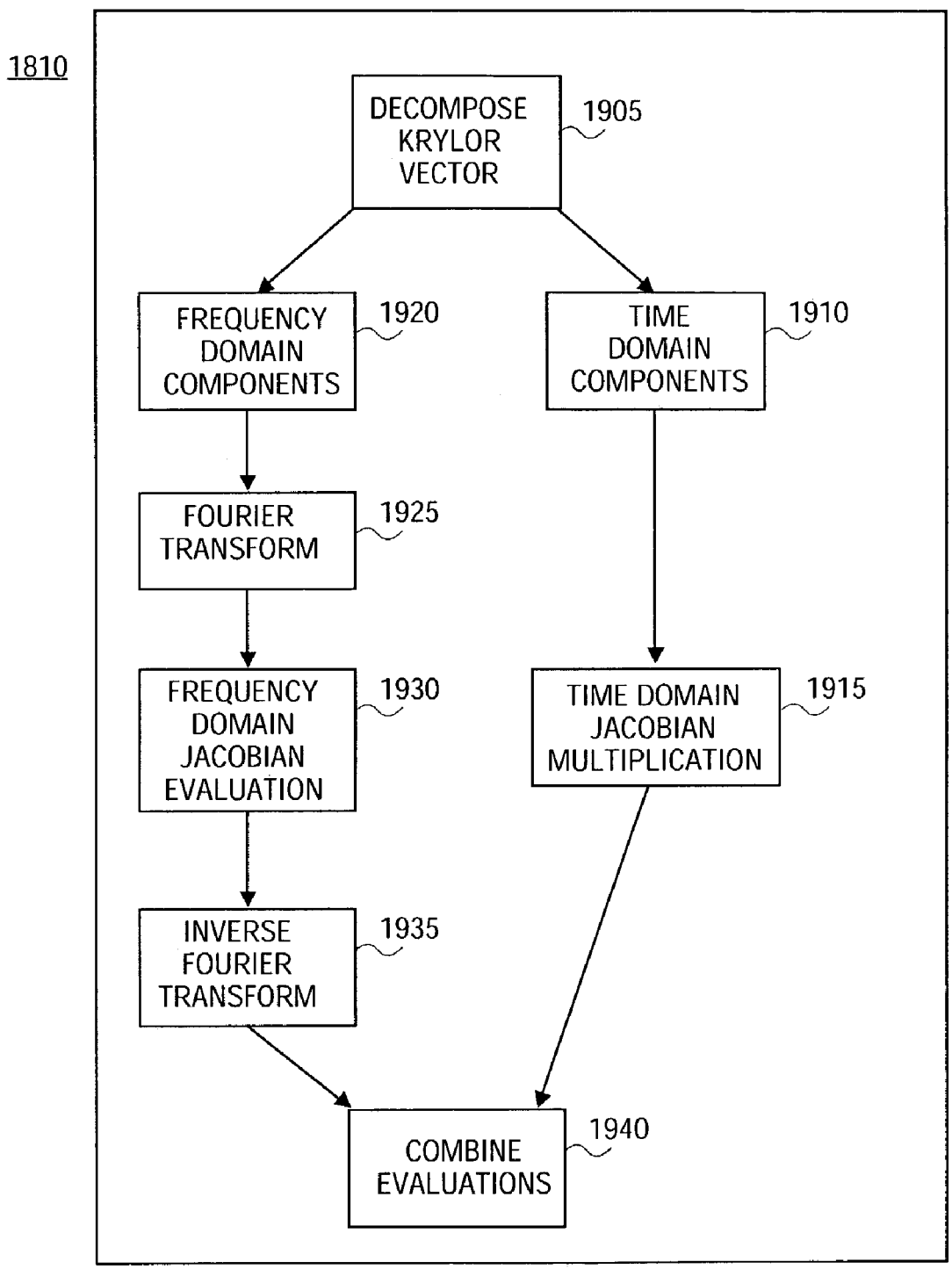
FIG. 19 is a flow chart of the matrix-vector product evaluation step in FIG. 18, used in the method of simulating a circuit.

FIG. 19 is a flow chart of the matrix-vector product evaluation 1810 step of FIG. 18. The Krylov subspace vector is decomposed 1905 into its frequency domain components 1920 and its time domain components 1910. The method 1400 takes the Fourier transform 1925 of the frequency domain components 1920, performs a frequency domain Jacobian matrix evaluation 1930 on the result, and then takes the inverse Fourier transform 1935 of the evaluation 1930. The method 1400 also performs a time domain Jacobian matrix multiplication 1915 using the time domain components 1910. The result of this multiplication 1915 is combined with the inverse Fourier transform 1935 of the frequency domain evaluation 1930 to produce the next Krylov solution approximation 1815.

E. CONCLUSION

The hybrid frequency-time domain approach for the treatment of distributed components, such as those described by frequency-dependent, tabulated S-parameters, is an effective technique for steady-state, time domain simulation of circuits with such components. Because of the spectral accuracy of the Chebyshev method, efficiency and accuracy are achieved through the transformation between the frequency and time domains using the Fourier and inverse Fourier transforms, for device evaluation involving frequency-dependent S-parameters. The various preferred embodiments use a matrix-implicit, Krylov-subspace method as the linear solver. The low-order rational fitting model the embodiments use as the preconditioner for the linear solver greatly improves its efficiency. Therefore, the method, computer program product, and implementing apparatus give more accurate results and have better convergence properties, and greater accuracy and efficiency than the pure rational-fitting lumped model approach.

Although particular embodiments of the present invention have been shown and described, it should be understood that the above discussion is not intended to limit the present invention to these embodiments. It will be appreciated by those of ordinary skill in the art that various changes and modifications may be made without departing from the spirit and scope of these embodiments. For example, the method, computer program product, and implementing apparatus can be conveniently extended to other time domain analyses, such as quasi-periodic steady-state analysis and small signal or noise analysis. Thus, the present invention is intended to cover alternatives, modifications, and equivalents that may fall within the spirit and scope of the present invention as defined by the claims.

What is claimed is:

1. An apparatus for simulating a circuit, comprising:
a computing apparatus receiving inputted circuit data; and
a computer program product executable by the computing apparatus to process the inputted circuit data by:
    modeling the circuit with a system of equations; partitioning a time interval on which the system of equations is defined;
    computing an interpolating polynomial; and
    applying an iterative method to solve the system of equations,
        wherein the iterative method comprises:
            performing an equation evaluation;
            computing an equation update;
            computing an error;
            comparing the error with a preset tolerance; and
            performing another iteration of the iterative method if the error exceeds the preset tolerance,
            wherein the computing apparatus stores at least the solution to the system of equations.

2. The apparatus of claim 1, wherein the iterative method is Newton's method.

3. The apparatus of claim 1, wherein the equation evaluation step comprises:
    decomposing a candidate solution vector to the system of equations into its time domain components and its frequency domain components;
    applying a Fourier transform to the frequency domain components;
    evaluating the time domain components in the time domain;
    evaluating the Fourier transformed frequency domain components in the frequency domain;
    applying an inverse Fourier transform to the evaluated Fourier transformed frequency domain components; and
    combining the evaluated time domain components with the inverse Fourier transformed, evaluated Fourier transformed frequency domain components.

4. The apparatus of claim 3, wherein the Fourier transform is computed using a Fast Fourier Transform method.

5. The apparatus of claim 3, wherein the Fourier transform is computed using a Chebyshev Fourier quadrature method.

6. The apparatus of claim 3, wherein the Fourier transform is computed using a non-equispaced fast transform method.

7. The apparatus of claim 1, wherein the step of computing an equation update comprises:
preparing information about a Jacobian matrix;
preparing a preconditioner; and
applying an iterative subspace solver.

8. The apparatus of claim 7, wherein the iterative subspace solver is a Krylov iterative subspace solver.

9. The apparatus of claim 7, wherein the step of applying the iterative subspace solver comprises:
computing a new direction vector;
performing a matrix-vector product evaluation;
computing a solution drawn from the subspace formed by the direction vectors;
computing an error;
comparing the error with a preset tolerance; and
performing another iteration of the iterative subspace solver if the error exceeds the preset tolerance.

10. The apparatus of claim 9, wherein the step of performing a matrix-vector product evaluation comprises:
decomposing a Krylov vector into its time domain components and its frequency domain components;
applying a Fourier transform to the frequency domain components;
performing a time domain Jacobian multiplication using the time domain components of the Krylov vector;
performing a frequency domain Jacobian subspace evaluation on the Fourier transformed frequency domain components of the Krylov vector;
applying an inverse Fourier transform to the frequency domain Jacobian subspace evaluation; and
combining the result of performing the time domain Jacobian multiplication with the inverse Fourier transformed, frequency domain Jacobian subspace evaluation.

11. The apparatus of claim 10, wherein the Fourier transform is computed using a Fast Fourier Transform method.

12. The apparatus of claim 10, wherein the Fourier transform is computed using a Chebyshev Fourier quadrature method.

13. The apparatus of claim 10, wherein the Fourier transform is computed using a non-equispaced fast transform method.

14. The apparatus of claim 7, wherein the Jacobian matrix is the Jacobian matrix of equations discretized according to the interpolating polynomial.

15. The apparatus of claim 7, wherein the Jacobian matrix is decomposed into a dynamic piece, a static piece, and a distributed piece.

16. The apparatus of claim 15, wherein the Jacobian matrix is represented as the sum of an upper triangular matrix and a lower triangular matrix, where the lower triangular matrix is the sum of the dynamic piece and the static piece, and the preconditioner is set equal to the lower triangular matrix.

17. The apparatus of claim 15, wherein the Jacobian matrix is represented as the sum of an upper triangular matrix and a lower triangular matrix, where the lower triangular matrix is the sum of the dynamic piece and the static piece, and the preconditioner is set equal to an approximation of the lower triangular matrix.

18. The apparatus of claim 16, wherein the preconditioner is constructed using a rational function model.

19. The apparatus of claim 1, wherein the system of equations is comprised of non-linear, differential algebraic equations.

20. The apparatus of claim 1, wherein the system of differential equations is of the form:

$$\frac{dQ(v(t))}{dt} + I(v(t)) + u(r) = 0;$$

where $Q(v(t)) \in R^n$ is a vector that represents the contribution of the dynamic elements of the circuit, $I(v(t)) \in R^n$ is a vector representing the static elements of the circuit, $u(t) \in R^n$ is a vector of inputs, and $v(t) \in R^n$ is a vector that contains state variables.

21. The apparatus of claim 1, wherein the system of equations is of the form:

$$\frac{dQ(v(t))}{dt} + I(v(t)) + \left[\sum_{k=1}^{K} P_k \int_{-\infty}^{t} H_k(t-\tau) P_k^T v(\tau) d\tau\right] + u(t) = 0,$$

where $Q(v(t)) \in R^n$ is a vector that represents the contribution of the dynamic elements of the circuit, $I(v(t)) \in R^n$ is a vector representing the static elements of the circuit, $u(t) \in R^n$ is a vector of inputs, $v(t) \in R^n$ is a vector that contains state variables, $H_k:(-\infty,t] \rightarrow R^{pk \times pk}$ is a $p_k \times p_k$ matrix of impulse responses for a kth distributed component, $P_k$ is a matrix having a one in the (i,j) entry if the jth connection to the kth device is through the state variable with index i, and having zeroes otherwise, $P_k^T$ is the transpose of $P_k$, and $P_k^T$ is an operator that extracts the relevant portion of the state vector.

22. The apparatus of claim 1, wherein the system of equations is of the form:

$$\frac{dQ(v(t))}{dt} + I(v(t)) + \left[\sum_{k=1}^{N} P_k F^* H_k(\omega) F P_k^T v\right] + u(t) = 0;$$

where $Q(v(t)) \in R^n$ is a vector that represents the contribution of the dynamic elements of the circuit, $I(v(t)) \in R^n$ is a vector representing the static elements of the circuit, $u(t) \in R^n$ is a vector of inputs, $v(t) \in R^n$ is a vector that contains state variables, $H_k(\omega)$—a frequency-dependent matrix—is the Fourier transform of a kth impulse response matrix, F is the matrix representation of the Fourier transform, $F^*$ is the conjugate transpose of F, $P_k$ is a matrix having a one in the (i,j) entry if the jth connection to the kth device is through the state variable with index i, and having zeroes otherwise, $P_k^T$ is the transpose of $P_k$, and $P_k^T$ is an operator that extracts the relevant portion of the state vector.

23. The apparatus of claim 1, wherein the system of equations is to be solved for steady-state conditions.

24. The apparatus of claim 1, wherein the system of equations is to be solved for periodic steady-state conditions.

25. The apparatus of claim 1, wherein the time interval is partitioned using Chebyshev Gauss-Lobatto collocation points.

26. The apparatus of claim 1, wherein the interpolating polynomial is computed using Chebyshev polynomials.

27. The apparatus of claim 1, wherein the interpolating polynomial is computed using Legendre polynomials.

28. The apparatus of claim 1, wherein the interpolating polynomial is computed using mutually orthogonal polynomials.

29. The apparatus of claim 1, wherein the derivative of the interpolating polynomial agrees with the derivative of the solution to the system of equations at each of the points of the partition of the time interval.

30. The apparatus of claim 1, further comprising a memory component storing at least the solution to the system of equations.

31. A computer program product comprising a computer usable medium having executable code that, when executed on a computing apparatus, causes the computing apparatus to execute a process for simulating a circuit, the process comprising:
modeling the circuit with a system of equations;
partitioning a time interval on which the system of equations is defined;
computing an interpolating polynomial;
applying an iterative method to solve the system of equations; and
storing the solution to the system of equations,
wherein the iterative method comprises:
performing an equation evaluation;
computing an equation update;
computing an error;
comparing the error with a preset tolerance; and
performing another iteration of the iterative method if the error exceeds the preset tolerance.

32. The computer program product of claim 31, wherein the equation evaluation step comprises:
decomposing a candidate solution vector to the system of equations into its time domain components and its frequency domain components;
applying a Fourier transform to the frequency domain components;
evaluating the time domain components in the time domain;
evaluating the Fourier transformed frequency domain components in the frequency domain;
applying an inverse Fourier transform to the evaluated Fourier transformed frequency domain components; and
combining the evaluated time domain components with the inverse Fourier transformed, evaluated Fourier transformed frequency domain components.

33. The computer program product of claim 31, wherein the step of computing an equation update comprises:
preparing information about a Jacobian matrix;
preparing a preconditioner; and
applying an iterative subspace solver.

34. The computer program product of claim 33, wherein the step of applying the iterative subspace solver comprises:
computing a new direction vector;
performing a matrix-vector product evaluation;
computing a solution drawn from the subspace formed by the direction vectors;
computing an error;
comparing the error with a preset tolerance; and
performing another iteration of the iterative subspace solver if the error exceeds the preset tolerance.

35. The computer program product of claim 34, wherein the step of performing a matrix-vector product evaluation comprises:
decomposing a Krylov vector into its time domain components and its frequency domain components;
applying a Fourier transform to the frequency domain components;
performing a time domain Jacobian multiplication using the time domain components of the Krylov vector;
performing a frequency domain Jacobian subspace evaluation on the Fourier transformed frequency domain components of the Krylov vector;
applying an inverse Fourier transform to the frequency domain Jacobian subspace evaluation; and
combining the result of performing the time domain Jacobian multiplication with the inverse Fourier transformed, frequency domain Jacobian subspace evaluation.

36. The computer program product of claim 33, wherein the Jacobian matrix is decomposed into a dynamic piece, a static piece, and a distributed piece.

37. The computer program product of claim 36, wherein the Jacobian matrix is represented as the sum of an upper triangular matrix and a lower triangular matrix, where the lower triangular matrix is the sum of the dynamic piece and the static piece, and the preconditioner is set equal to the lower triangular matrix.

38. The computer program product of claim 36, wherein the Jacobian matrix is represented as the sum of an upper triangular matrix and a lower triangular matrix, where the lower triangular matrix is the sum of the dynamic piece and the static piece, and the preconditioner is set equal to an approximation of the lower triangular matrix.

39. The computer program product of claim 37, wherein the preconditioner is constructed using a rational function model.

40. The computer program product of claim 31, wherein the solution to the system of equations is stored on a memory device.

41. A method for simulating a circuit with a computer program product executable by a computing apparatus, the method comprising:
modeling the circuit with a system of equations;
partitioning a time interval on which the system of equations is defined;
computing an interpolating polynomial;
applying an iterative method to solve the system of equations; and
storing the solution to the system of equations,
wherein the iterative method comprises:
performing an equation evaluation;
computing an equation update;
computing an error;
comparing the error with a preset tolerance; and
performing another iteration of the iterative method if the error exceeds the preset tolerance.

42. The method of claim 41, wherein the equation evaluation step comprises:
decomposing a candidate solution vector to the system of equations into its time domain components and its frequency domain components;
applying a Fourier transform to the frequency domain components;
evaluating the time domain components in the time domain;
evaluating the Fourier transformed frequency domain components in the frequency domain;
applying an inverse Fourier transform to the evaluated Fourier transformed frequency domain components; and combining the evaluated time domain components with the inverse Fourier transformed, evaluated Fourier transformed frequency domain components.

43. The method of claim 41, wherein the step of computing an equation update comprises:
preparing information about a Jacobian matrix;
preparing a preconditioner; and
applying an iterative subspace solver.

44. The method of claim 43, wherein the step of applying the iterative subspace solver comprises:
computing a new direction vector;
performing a matrix-vector product evaluation;
computing a solution drawn from the subspace formed by the direction vectors;
computing an error;
comparing the error with a preset tolerance; and
performing another iteration of the iterative subspace solver if the error exceeds the preset tolerance.

45. The method of claim 44, wherein the step of performing a matrix-vector product evaluation comprises:
decomposing a Krylov vector into its time domain components and its frequency domain components;
applying a Fourier transform to the frequency domain components;
performing a time domain Jacobian multiplication using the time domain components of the Krylov vector;
performing a frequency domain Jacobian subspace evaluation on the Fourier transformed frequency domain components of the Krylov vector;
applying an inverse Fourier transform to the frequency domain Jacobian subspace evaluation; and
combining the result of performing the time domain Jacobian multiplication with the inverse Fourier transformed, frequency domain Jacobian subspace evaluation.

46. The method of claim 43, wherein the Jacobian matrix is decomposed into a dynamic piece, a static piece, and a distributed piece.

47. The method of claim 46, wherein the Jacobian matrix is represented as the sum of an upper triangular matrix and a lower triangular matrix, where the lower triangular matrix is the sum of the dynamic piece and the static piece, and the preconditioner is set equal to the lower triangular matrix.

48. The method of claim 46, wherein the Jacobian matrix is represented as the sum of an upper triangular matrix and a lower triangular matrix, where the lower triangular matrix is the sum of the dynamic piece and the static piece, and the preconditioner is set equal to an approximation of the lower triangular matrix.

49. The method of claim 47, wherein the preconditioner is constructed using a rational function model.

50. The method of claim 41, wherein the solution to the system of equations is stored on a memory device.

51. A method for simulating a circuit with a computer program product executable by a computing apparatus, the method comprising:

a) modeling a circuit with a system of equations;
b) evaluating time domain components of the system of equations in the time domain;
c) transforming frequency domain components of the system of equations;
d) evaluating the transformed frequency domain components using time domain-based analysis;
e) generating simulation results by combining the evaluated time domain components and the evaluated frequency domain components; and
f) storing at least the simulation results.

52. The method of claim 51 in which (c) is performed with a Fourier transform.

53. The method of claim 51 in which an interpolating polynomial is computed.

54. The method of claim 51 in which an iterative method is performed.

55. The method of claim 54 in which the iterative method is Newton's method.

56. The method of claim 54 further comprising:
applying a subspace solver.

57. The method of claim 51, wherein the simulation results are stored on a memory device.

58. A computer program product comprising a computer usable medium having executable code that, when executed on a computing apparatus, causes the computing apparatus to execute a process for simulating a circuit, the process comprising:

a) modeling a circuit with a system of equations;
b) evaluating time domain components of the system of equations in the time domain;
c) transforming frequency domain components of the system of equations;
d) evaluating the transformed frequency domain components using time domain-based analysis;
e) generating simulation results by combining the evaluated time domain components and the evaluated frequency domain components; and
f) storing at least the simulation results.

59. The computer program product of claim 58 in which (c) is performed with a Fourier transform.

60. The computer program product of claim 58 in which an interpolating polynomial is computed.

61. The computer program product of claim 58 in which an iterative method is performed.

62. The computer program product of claim 61 in which the iterative method is Newton's method.

63. The computer program product of claim 61 further comprising:
applying a subspace solver.

64. The computer program product of claim 58, wherein the simulation results are stored on a memory device.

* * * * *